United States Patent
Hsu et al.

(10) Patent No.: US 9,391,083 B2
(45) Date of Patent: Jul. 12, 2016

(54) NONVOLATILE MEMORY STRUCTURE

(71) Applicant: eMemory Technology Inc., Hsin-Chu (TW)

(72) Inventors: Te-Hsun Hsu, Hsinchu County (TW); Wei-Ren Chen, Pingtung County (TW); Hsuen-Wei Chen, Hsinchu (TW); Mu-Ying Tsao, Changhua County (TW); Ying-Je Chen, Taichung (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 71 days.

(21) Appl. No.: 14/477,818

(22) Filed: Sep. 4, 2014

(65) Prior Publication Data
US 2015/0091074 A1 Apr. 2, 2015

Related U.S. Application Data

(60) Provisional application No. 61/885,021, filed on Oct. 1, 2013.

(51) Int. Cl.
| | |
|---|---|
| *H01L 29/788* | (2006.01) |
| *H01L 27/115* | (2006.01) |
| *H01L 29/423* | (2006.01) |
| *H01L 29/49* | (2006.01) |
| *G11C 5/14* | (2006.01) |
| *G11C 16/04* | (2006.01) |
| *G11C 16/28* | (2006.01) |
| *G11C 16/30* | (2006.01) |
| *G11C 7/12* | (2006.01) |
| *H01L 21/28* | (2006.01) |

(52) U.S. Cl.
CPC .......... *H01L 27/11558* (2013.01); *G11C 5/147* (2013.01); *G11C 7/12* (2013.01); *G11C 16/0408* (2013.01); *G11C 16/28* (2013.01); *G11C 16/30* (2013.01); *H01L 21/28273* (2013.01); *H01L 27/11519* (2013.01); *H01L 27/11521* (2013.01); *H01L 29/42328* (2013.01); *H01L 29/4916* (2013.01); *G11C 16/0433* (2013.01)

(58) Field of Classification Search
CPC ................. H01L 21/28273; H01L 2924/0002; H01L 29/0653; H01L 29/1054; H01L 29/7842; H01L 29/7849; H01L 29/78603; H01L 29/78612; H01L 29/78618; H01L 29/78687; H01L 27/115; H01L 27/11521; H01L 27/1152
See application file for complete search history.

(56) References Cited

U.S. PATENT DOCUMENTS

2008/0248620 A1  10/2008  Liu
2009/0200595 A1  8/2009  Nagai

FOREIGN PATENT DOCUMENTS

| TW | I295501 | 4/2008 |
| TW | 201338101 | 9/2013 |

*Primary Examiner* — Robert Bachner
(74) *Attorney, Agent, or Firm* — Winston Hsu; Scott Margo

(57) ABSTRACT

A nonvolatile memory structure included a P substrate, an N well in the P substrate, and a PMOS storage transistor. The PMOS storage transistor includes a floating gate and an auxiliary gate disposed in close proximity to the floating gate. The floating gate and the auxiliary gate are disposed directly on the same floating gate channel of the PMOS storage transistor. A gap is provided between the auxiliary gate and the floating gate such that the auxiliary gate and the floating gate are separated from each other at least directly above the floating gate channel.

25 Claims, 28 Drawing Sheets

|  | $V_{SL}$ | $V_{BL}$ | $V_{NW}$ | $V_{SG}$ | $V_{AG}$ | Mode |
|---|---|---|---|---|---|---|
| PGM(1) | VPP | 0V | VPP | VDD | -VAG~VAG | Hot Electron Injection |
| PGM(2) | 0V | -VPP | 0V | -VDD | -VAG~VAG | Hot Electron Injection |
| Read | VDD | 0V~1V | VDD | 0V~VDD | 0V~VDD | |

| VPP=2V~15V | VDD=2V~10V | VAG=2V~15V |
|---|---|---|

FIG. 4

|  | $V_{SL}$ | $V_{BL}$ | $V_{NW}$ | $V_{SG}$ | Mode |
|---|---|---|---|---|---|
| PGM(1) | VPP | 0V | VPP | VDD | Hot Electron Injection |
| PGM(2) | 0V | -VPP | 0V | -VDD | Hot Electron Injection |
| Read | VDD | 0V~1V | VDD | 0V~VDD | |

| VPP=2V~15V | VDD=2V~10V |
|---|---|

FIG. 8

|  | $V_{SL}$ | $V_{BL}$ | $V_{NW}$ | $V_{SG}$ | $V_{AG}$ | Mode |
|---|---|---|---|---|---|---|
| PGM(1) | VPP | 0V | VPP | VDD | -VAG~VAG | Hot Electron Injection |
| PGM(2) | 0V | -VPP | 0V | -VDD | -VAG~VAG | Hot Electron Injection |
| Read | VDD | 0V~1V | VDD | 0V~VDD | 0V~VDD | |

| VPP=2V~15V | VDD=2V~10V | VAG=2V~15V |
|---|---|---|

FIG. 13

| | $V_{SL}$ | $V_{BL}$ | $V_{NW}$ | $V_{SG}$ | $V_{AG}$ | Mode |
|---|---|---|---|---|---|---|
| PGM(1) | VPP | 0V | VPP | VDD | -VAG~VAG | Hot Electron Injection |
| PGM(2) | 0V | -VPP | 0V | -VDD | -VAG~VAG | Hot Electron Injection |
| Read | VDD | 0V~1V | VDD | 0V~VDD | 0V~VDD | |

| VPP=2V~15V | VDD=2V~10V | VAG=2V~15V |
|---|---|---|

FIG. 18

| | $V_{SL}$ | $V_{BL}$ | $V_{NW}$ | $V_{SG}$ | $V_{AG}$ | $V_{EL}$ | $V_{PW}$ | Mode |
|---|---|---|---|---|---|---|---|---|
| PGM(1) | VPP | 0V | VPP | VDD | -VAG~VAG | 0V~VDD | 0V | Hot Electron Injection |
| PGM(2) | 0V | -VPP | 0V | -VDD | -VAG~VAG | 0V~-VPP | 0V | Hot Electron Injection |
| ERS | 0V | 0V | 0V | 0V | 0V~-VAG/0V | VEE | 0V | Fowler-Nordheim Tunneling |
| Read | VDD | 0V~1V | VDD | 0V~VDD | 0V~$V_{DD}$ | 0V~VDD | 0V | |

| VPP=2V~15V | VDD=2V~10V | VAG=2V~15V | VEE=5V~20V |
|---|---|---|---|

FIG. 23

|  | $V_{SL}$ | $V_{BL}$ | $V_{NW}/V_{DNW}$ | $V_{SG}$ | $V_{AG}$ | $V_{EL}$ | $V_{PW}$ | Mode |
|---|---|---|---|---|---|---|---|---|
| PGM(1) | VPP | 0V | VPP | VDD | -VAG~VAG | 0V~VDD | 0V | Hot Electron Injection |
| PGM(2) | 0V | -VPP | 0V | -VDD | -VAG~VAG | 0V~-VPP | 0V | Hot Electron Injection |
| ERS | 0V | 0V | 0V | 0V | 0V~-VAG/0V | VEE | 0V | Fowler-Nordheim Tunneling |
| Read | VDD | 0V~1V | VDD | 0V~VDD | 0V~-VDD | 0V~VDD | 0V | |

| VPP=2V~15V | VDD=2V~10V | VAG=2V~15V | VEE=5V~20V |
|---|---|---|---|

FIG. 28

NONVOLATILE MEMORY STRUCTURE

CROSS REFERENCE TO RELATED APPLICATIONS

This application claims the benefit of U.S. application Ser. No. 61/885,021 filed Oct. 1, 2013, which is included in its entirety herein by reference.

BACKGROUND OF THE INVENTION

1. Field of the Invention

The present invention relates to a nonvolatile memory structure and, more particularly, to a nonvolatile single-poly memory cell structure.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory. MTP is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required. Therefore, the electric circuits for OTP are much simpler than those for the MTP to minimize the production procedures and cost.

MTP memory units and OTP memory units share similar stacking structures. Structurally speaking, current floating gate NVMs are divided into double-poly non-volatile memory and single-poly non-volatile memory. In the double-poly non-volatile memory, it usually comprises a floating gate for the storage of charges, an insulation layer (an ONO composite layer of silicon oxide/silicon nitride/silicon oxide for example), and a control gate for controlling the access of data. The operation of the memory unit is based on the principle of electric capacity, i.e. induced charges are stored in the floating gate to change the threshold voltage of the memory unit for determining the data status of "0" and "1." Because the single-poly non-volatile memory is compatible with regular CMOS process, it is usually applied in the field of embedded memory, embedded non-volatile memory in the mixed-mode circuits and micro-controllers (such as System on Chip, SOC) for example.

As dimensions and tunneling oxide of the memory cell unit continue to shrink, the operation voltages employed when programming the memory cell unit decreases. There is a strong need in this industry to improve the program efficiency of the nonvolatile memory while reduce the write current.

SUMMARY OF THE INVENTION

It is one objective of the invention to provide an improved nonvolatile memory structure with improved write efficiency, which is also capable of providing reduced write current and is compatible with the standard logic CMOS processes.

According to one embodiment, a nonvolatile memory cell unit includes a P type substrate; an N well in the P type substrate; and a PMOS storage transistor disposed on the N well, wherein the PMOS storage transistor comprises a floating gate, a P+ drain doping region, a common P+ doping region, a floating gate dielectric layer between the floating gate and the N well, a floating gate channel between the P+ drain doping region and the common P+ doping region, and an auxiliary gate disposed in close proximity to one side of the floating gate, wherein a gap is provided between the auxiliary gate and the floating gate such that the auxiliary gate and the floating gate are separated from each other at least directly above the floating gate channel.

According to one embodiment, a PMOS select transistor is also disposed on the N well, and the common P+ doping region is shared together by the PMOS select transistor and the PMOS storage transistor such that the PMOS storage transistor is serially connect to the PMOS select transistor. The PMOS select transistor comprises a select gate, a P+ source doping region, the common P+ doping region, and a select gate dielectric layer between the select gate and the N well. A select gate channel is between the P+ source doping region and the common P+ doping region.

According to one embodiment, the auxiliary gate has an elongate strip shape and extends in parallel with the floating gate.

According to one embodiment, the select gate and the floating gate are both composed of only a single layer of polysilicon.

According to one embodiment, a first spacer is disposed on either sidewall of the select gate, wherein a second spacer is disposed on a sidewall of the auxiliary gate and a sidewall of the floating gate, and wherein the gap is filled with a third spacer.

According to another aspect of the invention, a nonvolatile memory cell unit includes a semiconductor substrate having a first conductivity type; a well of a second conductivity type in the semiconductor substrate; a select transistor disposed on the well; and a storage transistor disposed on the well and being serially connected to the select transistor, wherein the storage transistor comprises a juxtaposed dual-gate structure that is disposed on a channel region of the storage transistor.

According to one embodiment, the juxtaposed dual-gate structure comprises an auxiliary gate and a floating gate.

According to one embodiment, the auxiliary gate and the floating gate are not connected to each other directly above the channel region.

According to one embodiment, a connecting portion is disposed between the auxiliary gate and the floating gate, wherein the connecting portion is situated directly on a shallow trench isolation structure, and wherein the connecting portion electrically connects the auxiliary gate with the floating gate.

According to one embodiment, a gap is provided between the auxiliary gate and the floating gate such that the auxiliary gate and the floating gate are separated from each other at least directly above the channel region.

According to one embodiment, the gap is filled with a spacer.

According to one embodiment, the select transistor and the storage transistor are both PMOS transistors.

According to one embodiment, the select transistor and the storage transistor commonly share a common P+ doping region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a table showing the voltage conditions of program operation and read operation of the cell unit.

FIG. 8 is a table showing the voltage conditions of program operation and read operation of the cell unit.

FIG. 13 is a table showing the voltage conditions of program operation and read operation of the cell unit.

FIG. 18 is a table showing the voltage conditions of program operation and read operation of the cell unit.

FIG. 23 is a table showing the voltage conditions of program operation, erase operation, and read operation of the cell unit.

FIG. 28 is a table showing the voltage conditions of program operation, erase operation, and read operation of the cell unit.

DETAILED DESCRIPTION

Figure 1:
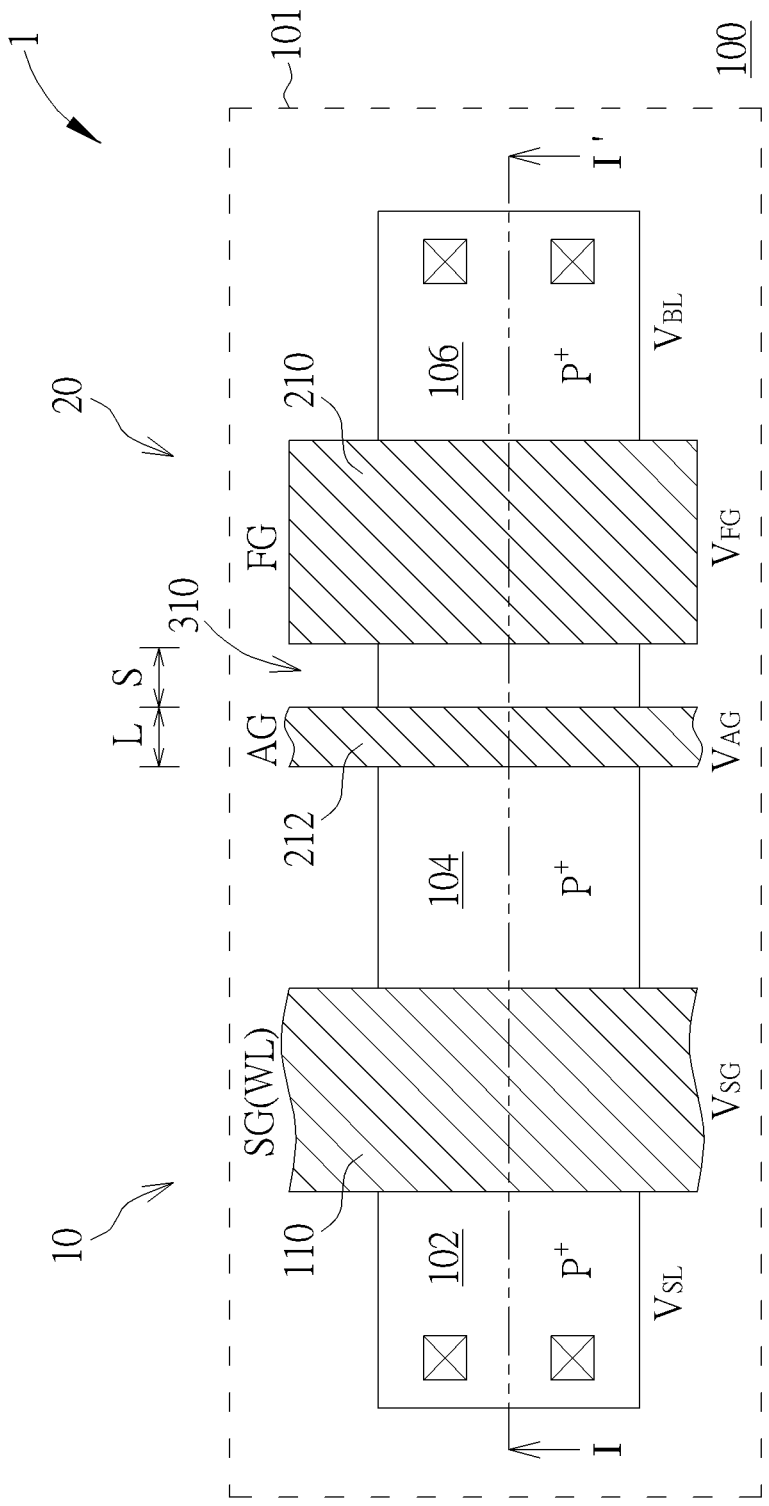
FIG. 1 is a schematic layout diagram showing a nonvolatile memory cell unit according to one embodiment of this invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 2:
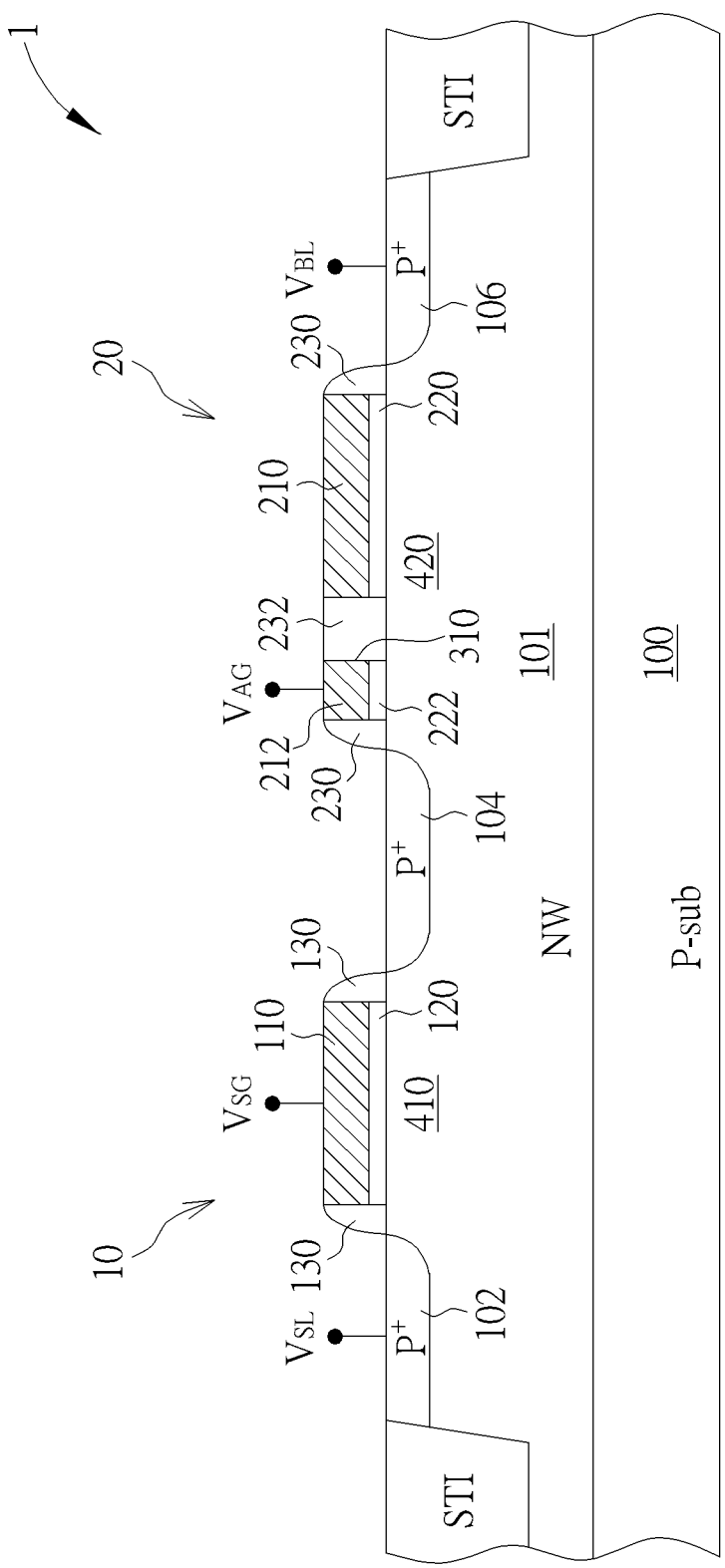
FIG. 2 is a cross-sectional view taken along line I-I' in FIG. 1.

FIG. 1 is a schematic layout diagram showing a nonvolatile memory cell unit according to one embodiment of this invention. FIG. 2 is a cross-sectional view taken along line I-I' in FIG. 1. As shown in FIG. 1 and FIG. 2, the nonvolatile memory cell unit 1 comprises a first PMOS transistor (PMOS select transistor) 10 and a second PMOS transistor (PMOS storage transistor) 20 that is serially connected to the first PMOS transistor 10. The first PMOS transistor 10 and the second PMOS transistor 20 are formed together on an N well 101 of a P type substrate 100. It is to be understood that a pick-up doping region (not shown) may be provided to provide the N well 101 with a pre-selected operation voltage $V_{NW}$. The P substrate 100 may be a P type semiconductor substrate such as a P type silicon substrate.

According to the embodiment, the first PMOS transistor 10 comprises a select gate (SG) 110, a P+ source doping region 102, a common P+ doping region 104, and a first gate dielectric layer 120 between the select gate (SG) 110 and the N well 101. A first channel 410 is defined between the P+ source doping region 102 and the common P+ doping region 104. The second PMOS transistor 20 comprises a floating gate (FG) 210, a P+ drain doping region 106, the common P+ doping region 104, and a second gate dielectric layer 220 between the floating gate (FG) 210 and the N well 101. A second channel 420 is defined between the common P+ doping region 104 and the P+ drain doping region 106. The common P+ doping region 104 is shared by the first PMOS transistor 10 and the second PMOS transistor 20. According to the embodiment, the second PMOS transistor 20 further comprises an auxiliary gate (AG) 212 that is disposed in close proximity to the floating gate (FG) 210. The auxiliary gate (AG) 212 extends along one side of the floating gate (FG) 210. A gap 310 is provided between the auxiliary gate (AG) 212 and the floating gate (FG) 210 such that the auxiliary gate (AG) 212 and the floating gate (FG) 210 are separated from each other at least directly above the second channel 420. According to the embodiment, the auxiliary gate (AG) 212 has an elongate strip shape and extends in parallel with the floating gate (FG) 210. According to the embodiment, the auxiliary gate (AG) 212 has a line width L that may be equal to the minimum feature size or the critical dimension (CD), and the gap 310 has a width S that may be equal to the minimum feature size or the critical dimension, but not limited thereto. According to the embodiment, the line width L of the auxiliary gate (AG) 212 may be equal to the width S of the gap 310. However, in other cases, the line width L of the auxiliary gate (AG) 212 may not be equal to the width S of the gap 310. According to the embodiment, the first PMOS transistor 10 as a select transistor comprises only one gate, while the second PMOS transistor 20 as a storage transistor has a juxtaposed dual-gate structure.

According to the embodiment, the select gate (SG) 110 and the floating gate (FG) 210 are both composed of only a single layer of polysilicon. Therefore, no control gate is formed above the floating gate (FG) 210. A first spacer 130 is disposed on either sidewall of the select gate (SG) 110. A second spacer 230 is disposed on a sidewall of the auxiliary gate (AG) 212 and on a sidewall of the floating gate (FG) 210. The gap 310 between the auxiliary gate (AG) 212 and the floating gate (FG) 210 is filled with a third spacer 232. Since the P+ source doping region 102, the common P+ doping region 104, and the P+ drain doping region 106 are implanted into the N well 101 after the formation of the first spacer 130, the second spacer 230, and the third spacer 232, and are self-aligned with the first spacer 130, the second spacer 230, and the third spacer 232, the P type dopants are not implanted into the channel 420 via the gap 310 when ion implanting the P+ source doping region 102, the common P+ doping region 104, and the P+ drain doping region 106. When program operation is performed, the auxiliary gate (AG) 212 is able to control the resistance of the channel region that is directly under the auxiliary gate (AG) 212 and close to the gap 310. By slightly raising the channel resistance at the channel region that is directly under the auxiliary gate (AG) 212 and close to the gap 310, the write current can be effectively reduced. In addition, during the program operation, the possibility of generating the electron-hole pairs at the channel region that is directly under the auxiliary gate (AG) 212 and close to the gap 310 increases, thereby improving the program efficiency.

Although a PMOS select transistor 10 is shown in the figures, it is to be understood that in other cases an NMOS select transistor may be employed.

Figure 3:
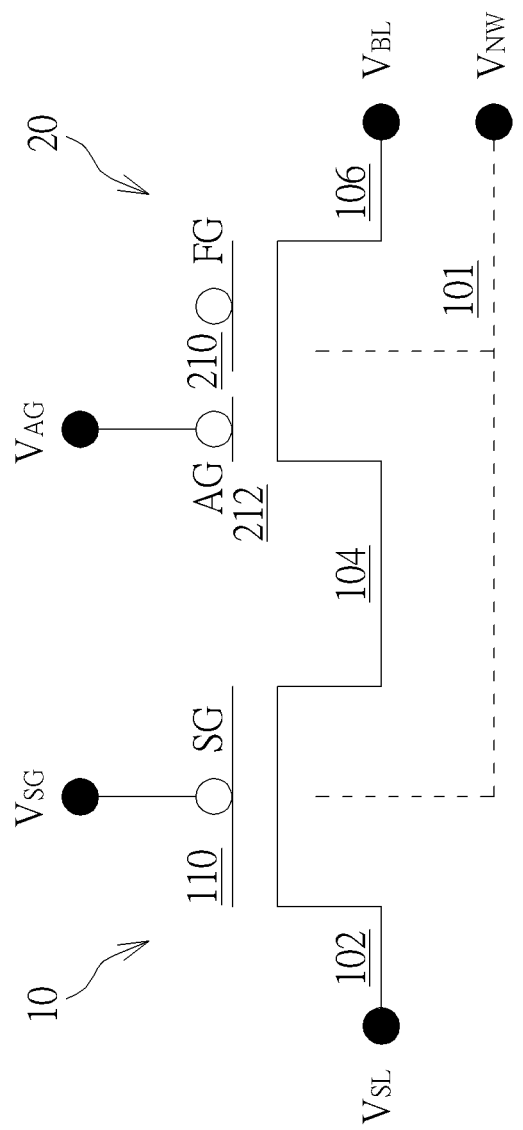
FIG. 3 is an equivalent circuit diagram of the nonvolatile memory cell unit of FIG. 1.

Please refer to FIG. 3 and FIG. 4. FIG. 3 is an equivalent circuit diagram of the nonvolatile memory cell unit of FIG. 1. FIG. 4 is a table showing the voltage conditions of program operation and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. No external voltage is applied to the floating gate (FG) 210. Therefore, the floating gate (FG) 210 remains floating. An auxiliary gate voltage ($V_{AG}$) may be applied to the auxiliary gate (AG) 212. An N well voltage ($V_{NW}$) may be applied to the N well 101. The P substrate 100 may be grounded. As shown in FIG. 4, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$, the auxiliary gate voltage ($V_{AG}$) may be a voltage between $-V_{AG}$ and $V_{AG}$, wherein $V_{AG}$=2V~15V. In another case, when program operation (PGM(2)) is performed, the source line voltage ($V_{SL}$) and the N well voltage ($V_{NW}$) may be 0V, the bit line voltage ($V_{BL}$) may be $-V_{PP}$, the select gate voltage ($V_{SG}$) may be $-V_{DD}$, the auxiliary gate voltage ($V_{AG}$) may be $-V_{DD}$ or 0V. Alternatively, the auxiliary gate voltage ($V_{AG}$) may be a voltage between $-V_{AG}$ and $V_{AG}$, wherein $V_{AG}$=2V~15V. In read operation (READ), the source line voltage ($V_{SL}$) and the N well voltage ($V_{NW}$) may be $V_{DD}$, the bit line voltage ($V_{BL}$) may be 0~1V, the select gate voltage ($V_{SG}$) may be 0V~$V_{DD}$, and the auxiliary gate voltage ($V_{AG}$) may be 0V~$V_{DD}$.

Figure 5:
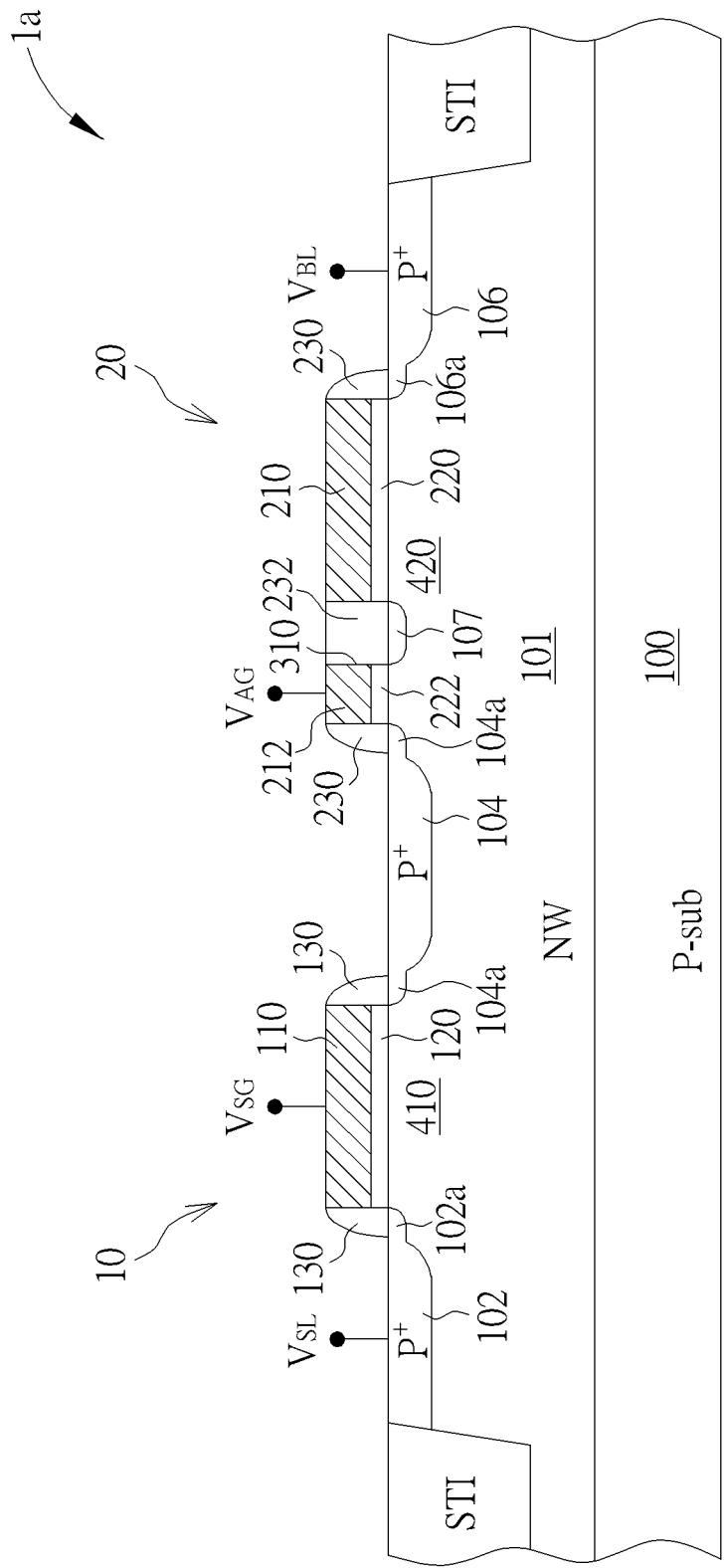
FIG. 5 is a schematic, cross-sectional diagram showing a nonvolatile memory cell unit according to another embodiment of this invention.

FIG. 5 is a schematic, cross-sectional diagram showing a nonvolatile memory cell unit 1a according to another embodiment of this invention, wherein like reference numerals designate like elements or regions. The nonvolatile memory cell unit 1a is different from the nonvolatile memory cell unit 1 of FIG. 2 in that the nonvolatile memory cell unit 1a includes a lightly doped region 102a directly under the first spacer 130. The lightly doped region 102a is merged with the P+ source doping region 102. On the other side, under the second spacer 230, a lightly doped region 104a is provided. The lightly doped region 104a is merged with the common P+ doping region 104. A lightly doped region 106a that is spaced apart from the lightly doped region 104a is merged with the P+ drain doping region 106. In addition, a lightly doped region 107 is provided directly under the gap 310 and the third spacer 232. According to the embodiment, the lightly doped region 102a, the lightly doped region 104a, the lightly doped region 106a, and the lightly doped region 107 are all P type doped regions.

Figure 6:
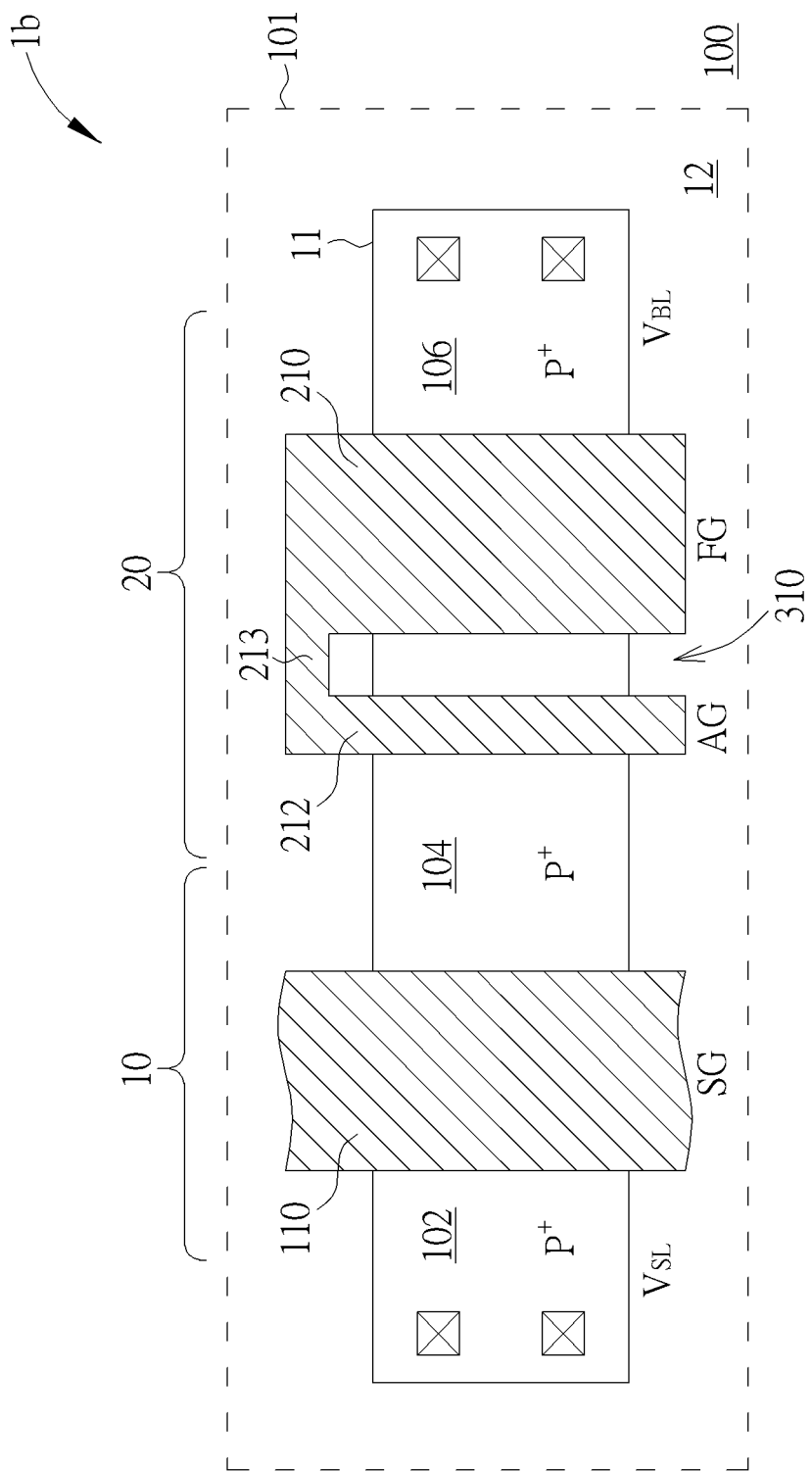
FIG. 6 is a schematic layout diagram showing a nonvolatile memory cell unit according to another embodiment of this invention.

FIG. 6 is a schematic layout diagram showing a nonvolatile memory cell unit 1b according to another embodiment of this invention, wherein like reference numerals designate like elements or regions. As shown in FIG. 6, the nonvolatile memory cell unit 1b is different from the nonvolatile memory cell unit 1 of FIG. 1 in that the nonvolatile memory cell unit 1b further comprises a connecting portion 213 between the auxiliary gate (AG) 212 and the floating gate (FG) 210. The connecting portion 213 is situated directly on a shallow trench isolation structure 12 surrounding the active area 11. The connecting portion 213 electrically connects the auxiliary gate (AG) 212 with the floating gate (FG) 210. In operation, the auxiliary gate (AG) 212 and the floating gate (FG) 210 both remain floating. That is, no external voltages are applied to the auxiliary gate (AG) 212 and the floating gate (FG) 210.

Figure 7:
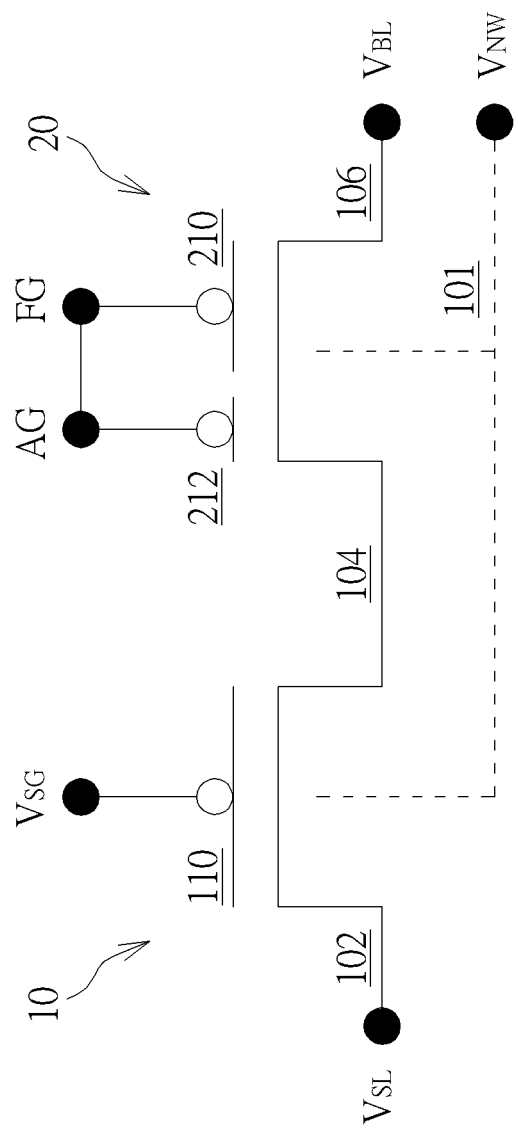
FIG. 7 is an equivalent circuit diagram of the nonvolatile memory cell unit of FIG. 6.

Please refer to FIG. 7 and FIG. 8. FIG. 7 is an equivalent circuit diagram of the nonvolatile memory cell unit of FIG. 6. FIG. 8 is a table showing the voltage conditions of program operation and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. No external voltage is applied to the floating gate (FG) 210 or the auxiliary gate (AG) 212. Therefore, the floating gate (FG) 210 and the auxiliary gate (AG) 212 remain floating. An N well voltage ($V_{NW}$) may be applied to the N well 101. The P substrate 100 may be grounded. As shown in FIG. 8, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$. In another case, when program operation (PGM(2)) is performed, the source line voltage ($V_{SL}$) and the N well voltage ($V_{NW}$) may be 0V, the bit line voltage ($V_{BL}$) may be $-V_{PP}$, the select gate voltage ($V_{SG}$) may be $-V_{DD}$. In read operation (READ), the source line voltage ($V_{SL}$) and the N well voltage ($V_{NW}$) may be $V_{DD}$, the bit line voltage ($V_{BL}$) may be 0~1V, and the select gate voltage ($V_{SG}$) may be 0V~$V_{DD}$.

Figure 9:
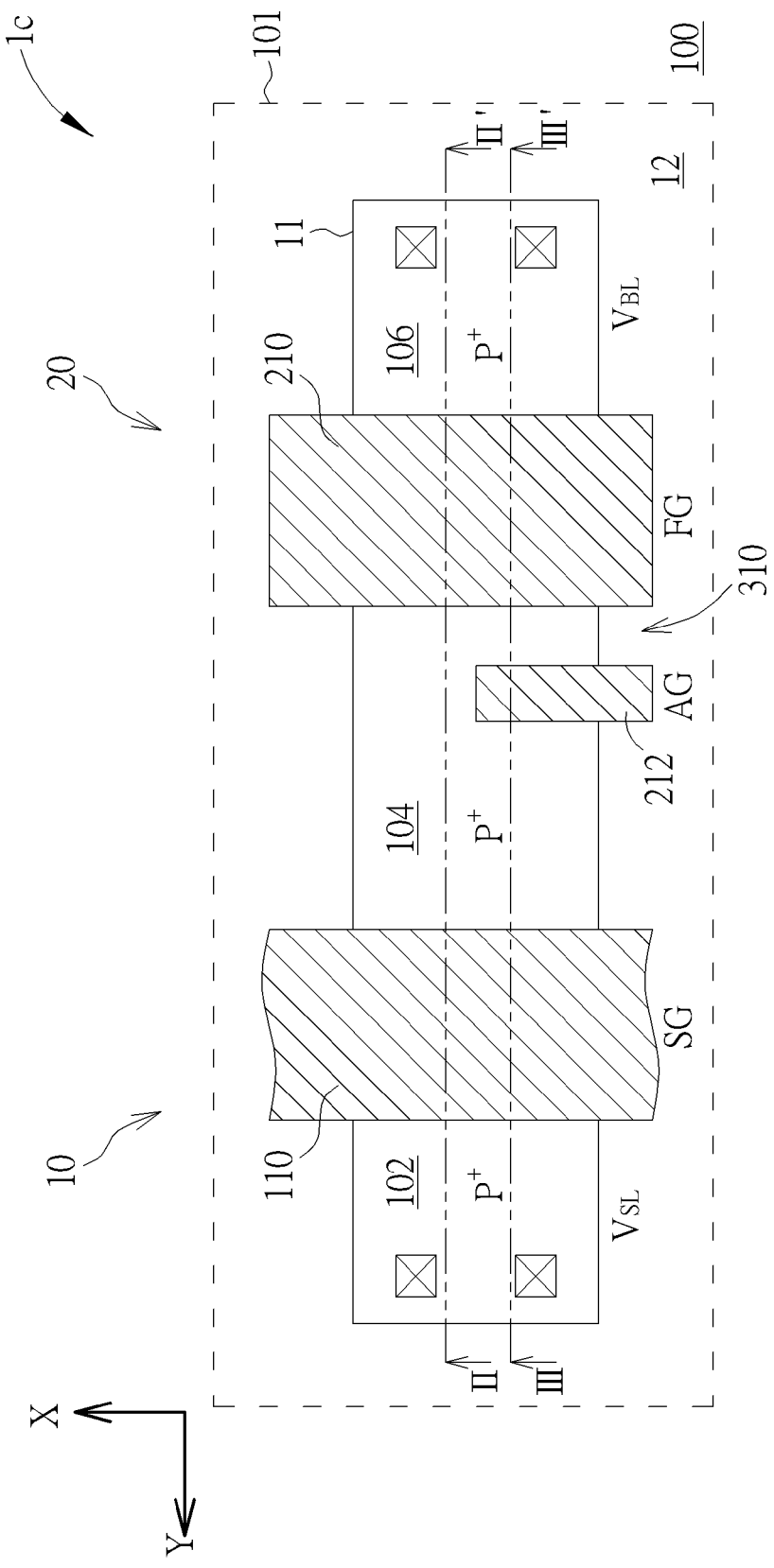
FIG. 9 is a schematic layout diagram showing a nonvolatile memory cell unit according to another embodiment of this invention.
Figure 10:
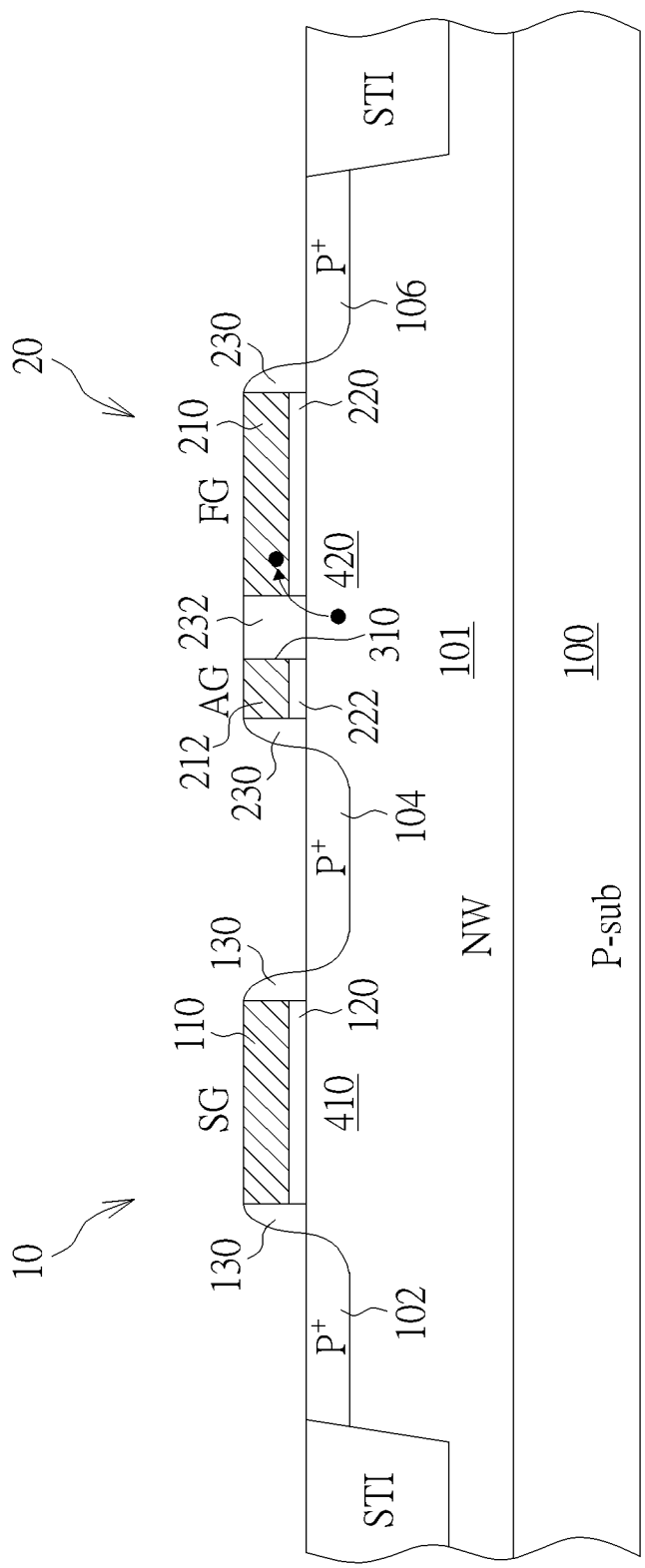
FIG. 10 is a cross-sectional view taken along line II-II' in FIG. 9.
Figure 11:
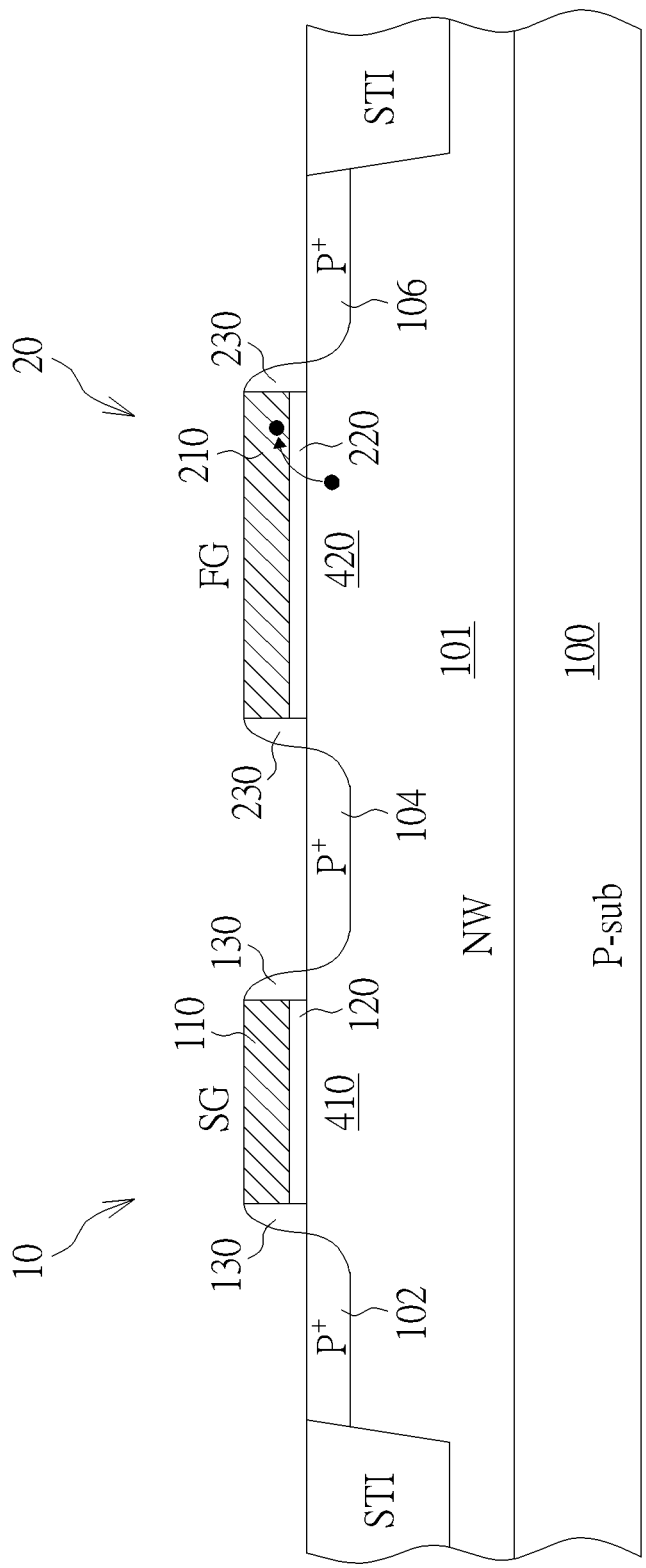
FIG. 11 is a cross-sectional view taken along line III-III' in FIG. 9.

Please refer to FIG. 9 to FIG. 11. FIG. 9 is a schematic layout diagram showing a nonvolatile memory cell unit 1c according to another embodiment of this invention, wherein like reference numerals designate like elements or regions. FIG. 10 is a cross-sectional view taken along line II-II' in FIG. 9. FIG. 11 is a cross-sectional view taken along line III-III' in FIG. 9. As shown in FIG. 9, FIG. 10, and FIG. 11, likewise, the nonvolatile memory cell unit 1c has a select gate (SG) 110, a floating gate (FG) 210, and an auxiliary gate (AG) 212, which all extend along a first direction (or reference x-axis). The select gate (SG) 110 and the floating gate (FG) 210 both traverse the active area 11 in the x-axis direction. The nonvolatile memory cell unit 1c is different from the nonvolatile memory cell unit 1 of FIG. 1 in that the auxiliary gate (AG) 212 of the nonvolatile memory cell unit 1c does not traverses the active area 11 in the x-axis direction. The auxiliary gate (AG) 212 partially overlaps with the active area 11 from one side of the active area 11, thereby forming an asymmetric gate configuration. For example, the auxiliary gate (AG) 212 of the nonvolatile memory cell unit 1c may have a length, in the x-axis direction, which is about half of the length of the floating gate (FG) 210 in the x-axis direction, but not limited thereto.

Figure 12:
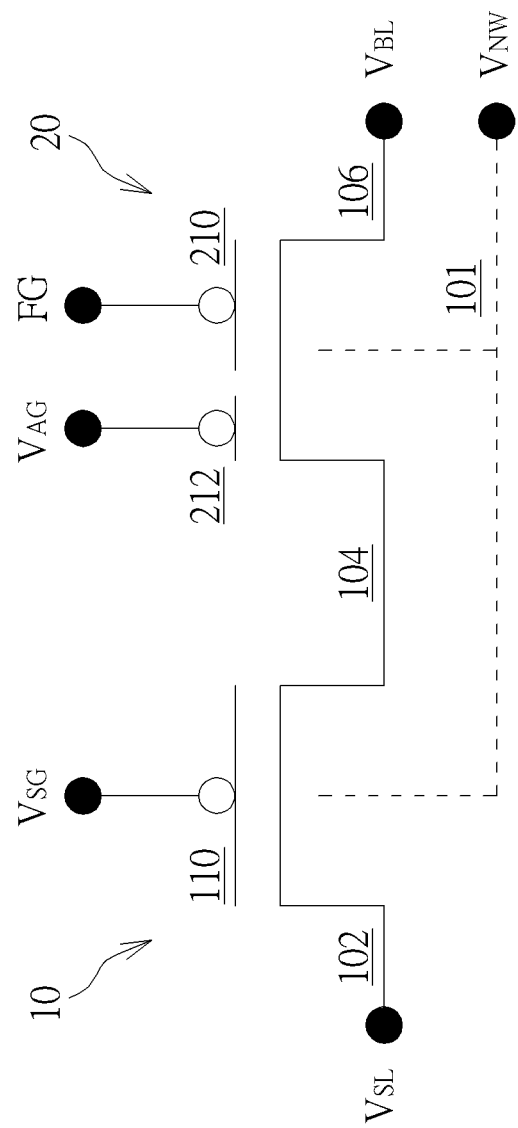
FIG. 12 is an equivalent circuit diagram of the nonvolatile memory cell unit of FIG. 9.

Please refer to FIG. 12 and FIG. 13. FIG. 12 is an equivalent circuit diagram of the nonvolatile memory cell unit of FIG. 9. FIG. 13 is a table showing the voltage conditions of program operation and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. No external voltage is applied to the floating gate (FG) 210. Therefore, the floating gate (FG) 210 remains floating. An auxiliary gate voltage ($V_{AG}$) may be applied to the auxiliary gate (AG) 212. An N well voltage ($V_{NW}$) may be applied to the N well 101. As shown in FIG. 13, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$, the auxiliary gate voltage ($V_{AG}$) may be $V_{DD}$ or 0V. Alternatively, the auxiliary gate voltage ($V_{AG}$) may be a voltage between $-V_{AG}$ and $V_{AG}$, wherein $V_{AG}$=2V~15V. In another case, when program operation (PGM(2)) is performed, the source line voltage ($V_{SL}$) and the N well voltage ($V_{NW}$) may be 0V, the bit line voltage ($V_{BL}$) may be $-V_{PP}$, the select gate voltage ($V_{SG}$) may be $-V_{DD}$, and be auxiliary gate voltage ($V_{AG}$) may be a voltage between $-V_{AG}$ and $V_{AG}$, wherein $V_{AG}$=2V~15V. In read operation (READ), the source line voltage ($V_{SL}$) and the N well voltage ($V_{NW}$) may be $V_{DD}$, the bit line voltage ($V_{BL}$) may be 0~1V, the select gate voltage ($V_{SG}$) may be 0V~$V_{DD}$, and the auxiliary gate voltage ($V_{AG}$) may be 0V~$V_{DD}$.

Figure 14:
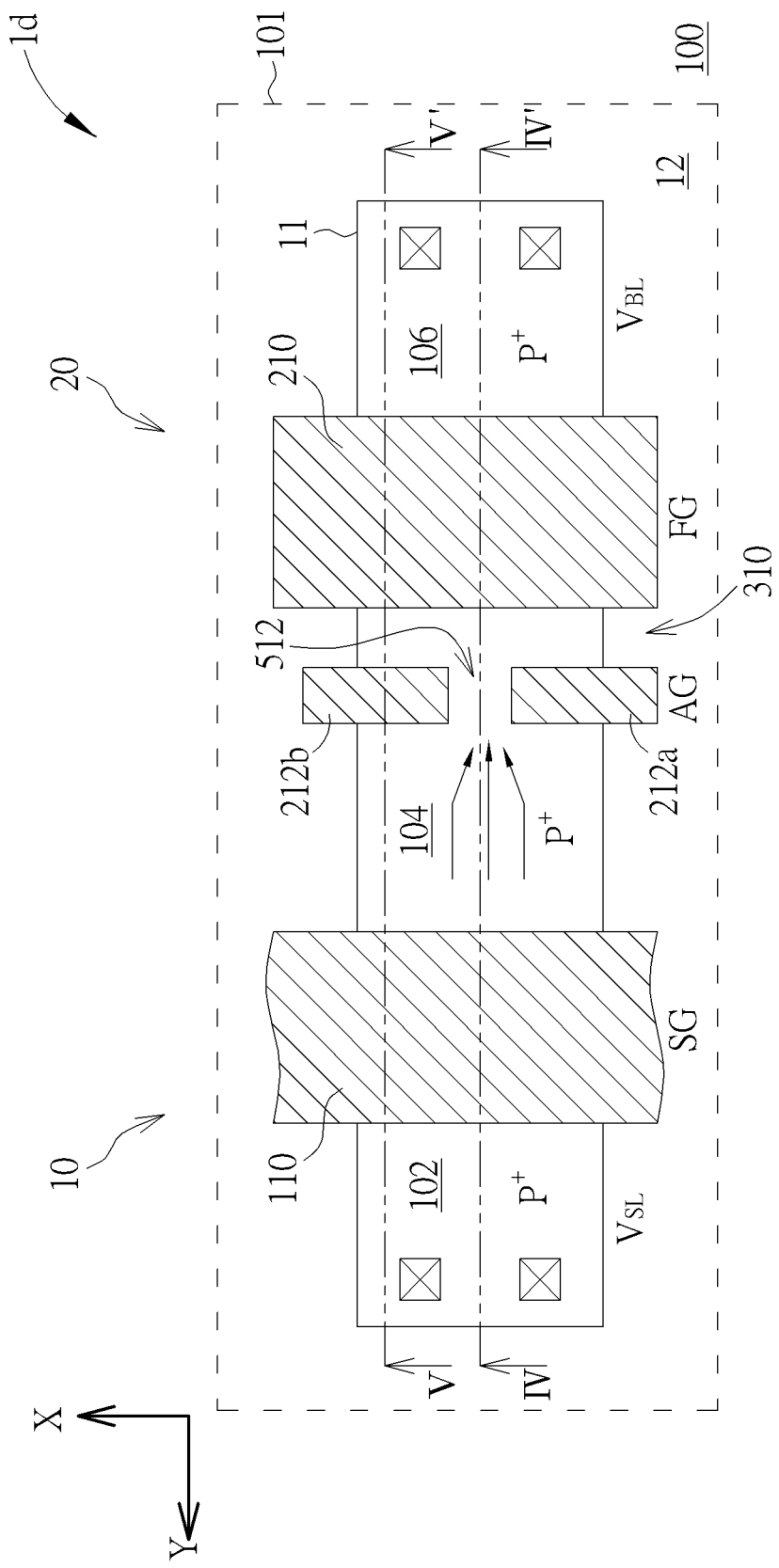
FIG. 14 is a schematic layout diagram showing a nonvolatile memory cell unit according to another embodiment of this invention.
Figure 15:
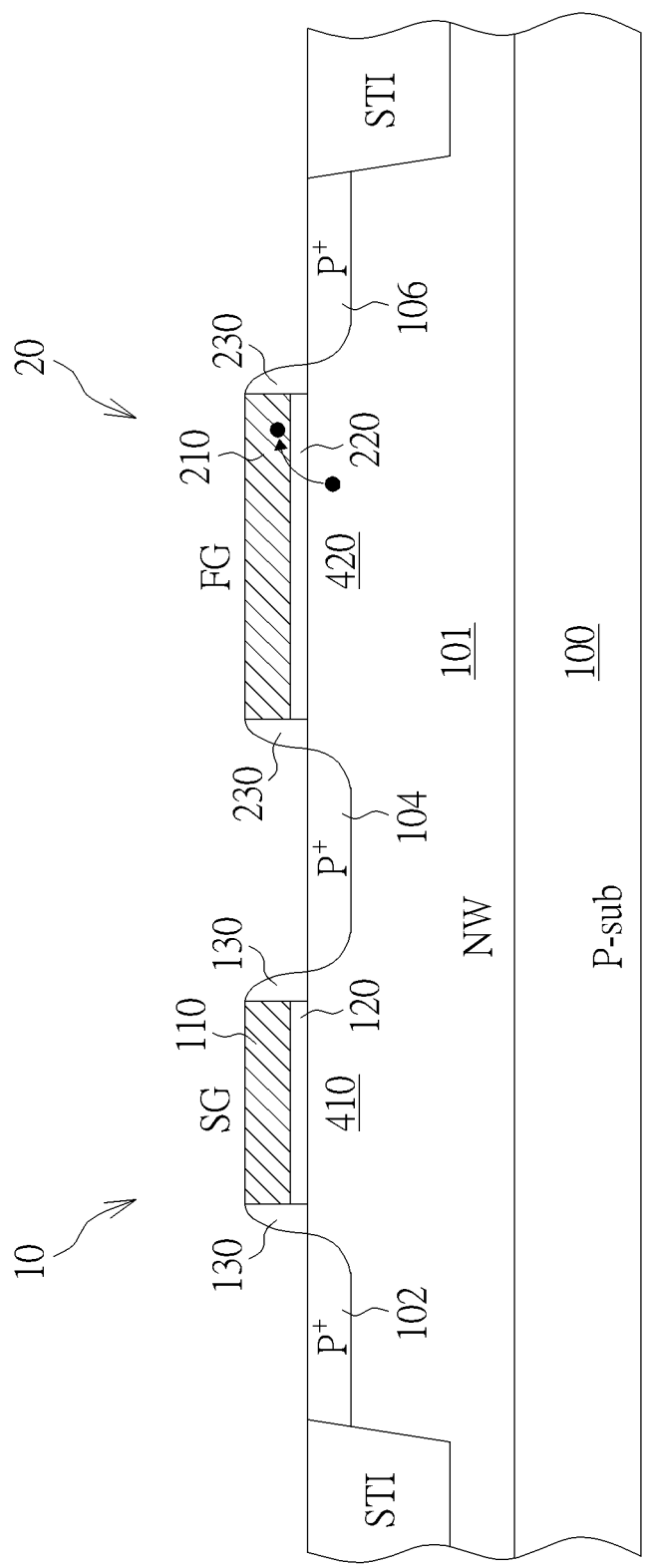
FIG. 15 is a cross-sectional view taken along line IV-IV' in FIG. 14.
Figure 16:
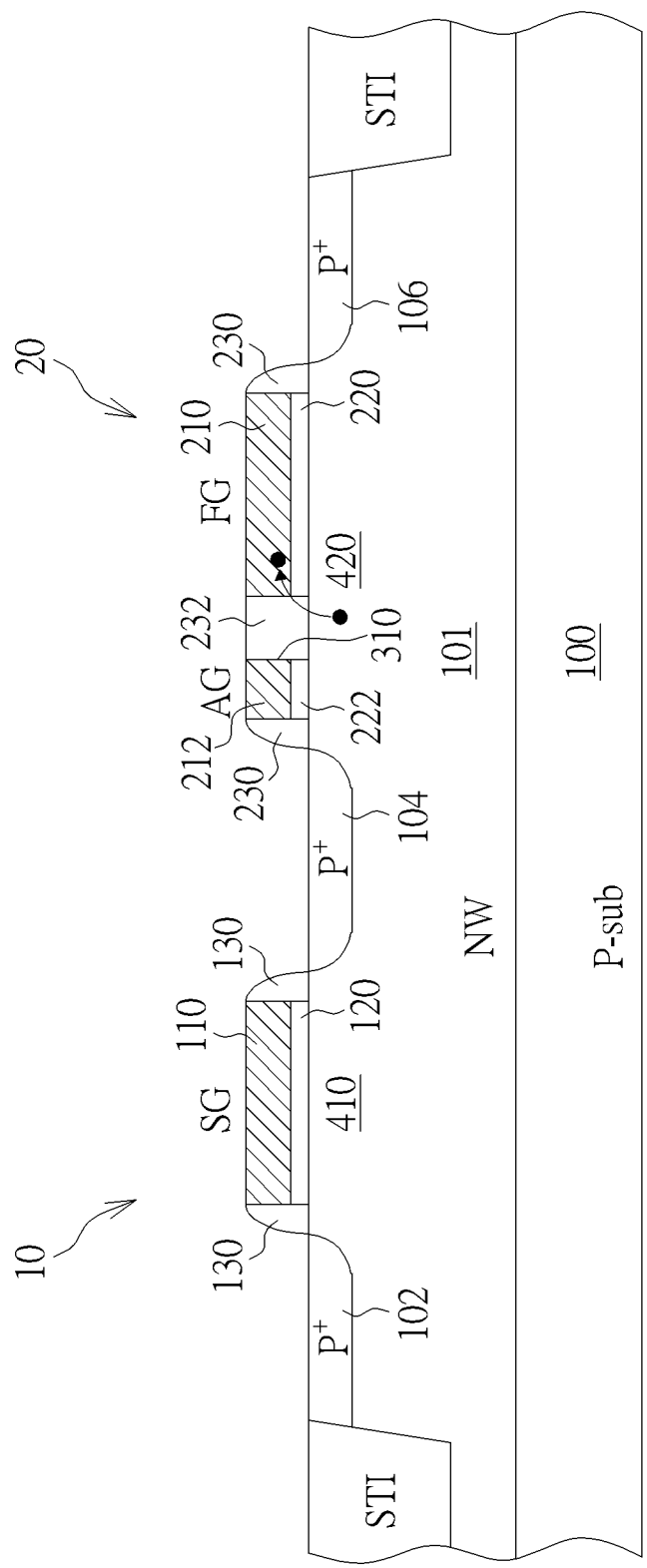
FIG. 16 is a cross-sectional view taken along line V-V' in FIG. 14.

Please refer to FIG. 14 to FIG. 16. FIG. 14 is a schematic layout diagram showing a nonvolatile memory cell unit 1d according to another embodiment of this invention, wherein like reference numerals designate like elements or regions. FIG. 15 is a cross-sectional view taken along line IV-IV' in FIG. 14. FIG. 16 is a cross-sectional view taken along line V-V' in FIG. 14. As shown in FIG. 14, FIG. 15, and FIG. 16, likewise, the nonvolatile memory cell unit 1d has a select gate (SG) 110, a floating gate (FG) 210, and an auxiliary gate (AG) 212, which all extend along a first direction (or reference x-axis). The select gate (SG) 110 and the floating gate (FG) 210 both traverse the active area 11 in the x-axis direction. The lengthwise direction of the active area 11 is in parallel with the reference y-axis. The nonvolatile memory cell unit 1d is different from the nonvolatile memory cell unit 1 of FIG. 1 in that the auxiliary gate (AG) 212 of the nonvolatile memory cell unit 1 is continuous on the active area 11 and traverses the active area 11 in the reference x-axis direction, while the auxiliary gate (AG) 212 of the nonvolatile memory cell unit 1d is not a continuous structure and is split into two parts directly above the channel region in the reference x-axis direction. The auxiliary gate (AG) 212 is split into auxiliary gate 212a and auxiliary gate 212b on the two opposite sides of the active area 11. A gap 512 is provided between the auxiliary gate 212a and the auxiliary gate 212b. Therefore, the auxiliary gate 212a is not in direct contact with the auxiliary gate 212b. In write (program) operation, the electron current as the arrows indicated in FIG. 14 may be concentrated at the channel region that is close to the gap 512, which has relatively lower resistance, thereby improving the write efficiency.

Figure 17:
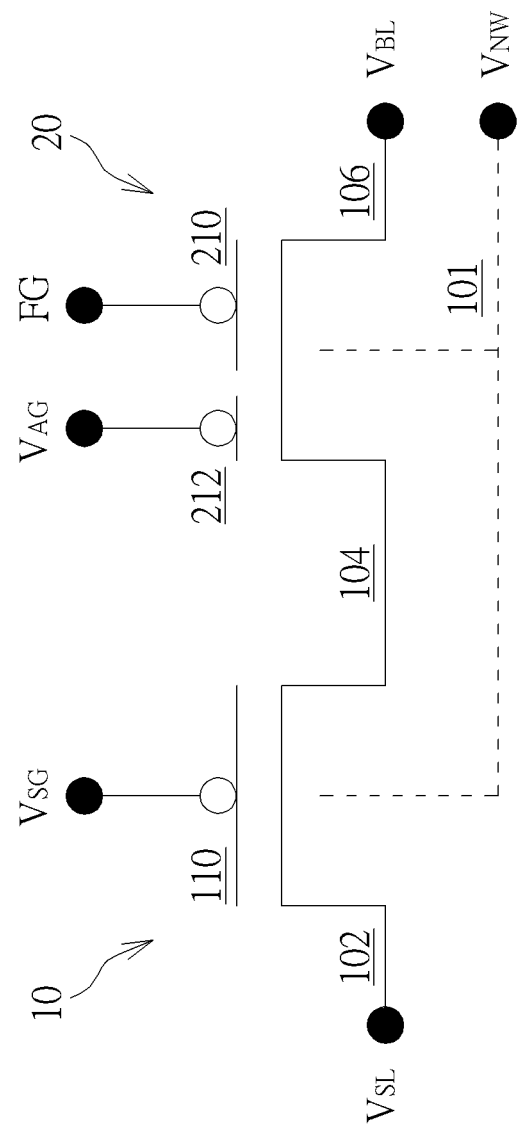
FIG. 17 is an equivalent circuit diagram of the nonvolatile memory cell unit of FIG. 14.

Please refer to FIG. 17 and FIG. 18. FIG. 17 is an equivalent circuit diagram of the nonvolatile memory cell unit of FIG. 14. FIG. 18 is a table showing the voltage conditions of program operation and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. No external voltage is applied to the floating gate (FG) 210. Therefore, the floating gate (FG) 210 remains floating. An auxiliary gate voltage ($V_{AG}$) may be applied to the auxiliary gate (AG) 212. An N well voltage ($V_{NW}$) may be applied to the N well 101. As shown in FIG. 18, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$, the auxiliary gate voltage ($V_{AG}$) may be a voltage between $-V_{AG}$ and $V_{AG}$, wherein $V_{AG}$=2V~15V. In another case, when program operation (PGM(2)) is performed, the source line voltage ($V_{SL}$) and the N well voltage ($V_{NW}$) may be 0V, the bit line voltage ($V_{BL}$) may be $-V_{PP}$, the select gate voltage ($V_{SG}$) may be $-V_{DD}$, and the auxiliary gate voltage ($V_{AG}$) may be $-V_{DD}$ or 0V. Alternatively, the auxiliary gate voltage ($V_{AG}$) may be a voltage between $-V_{AG}$ and $V_{AG}$, wherein $V_{AG}$=2V~15V. In read operation (READ), the source line voltage ($V_{SL}$) and the N well voltage ($V_{NW}$) may be $V_{DD}$, the bit line voltage ($V_{BL}$) may be 0~1V, the select gate voltage ($V_{SG}$) may be 0V~$V_{DD}$, and the auxiliary gate voltage ($V_{AG}$) may be 0V~$V_{DD}$.

To sum up, FIG. 1 to FIG. 18 generally introduce a single-poly one-time programmable (OTP) memory scheme that may be programmed and read. The germane technical features of the OTP memory structure as described above include the auxiliary gate 212 that is in close proximity to the floating gate 210. The auxiliary gate 212 and the floating gate 210 both belong to one PMOS transistor, i.e., the second PMOS transistor 20, and are disposed on the same channel, i.e., second channel 420. The second PMOS transistor 20 having the auxiliary gate 212 is serially connected to the PMOS select transistor 10 that is adjacent to the auxiliary gate 212, thereby forming a memory cell unit. In one embodiment (as depicted in FIG. 1), the auxiliary gate (AG) 212 may be independent from the floating gate, and an auxiliary gate voltage ($V_{AG}$) may be applied to the auxiliary gate (AG) 212 when in operation. In another embodiment (as depicted in FIG. 6), the auxiliary gate (AG) 212 may be electrically connected to the floating gate, and, in operation, the auxiliary gate (AG) 212 and the floating gate are both floating. In addition, the auxiliary gate (AG) 212 may completely traverse the active area in the reference x-axis (as depicted in FIG. 1 and FIG. 6). Alternatively, the auxiliary gate (AG) 212 may not traverse the active area in the reference x-axis (as depicted in FIG. 9). By providing the auxiliary gate (AG) 212, a partial channel of the PMOS transistor 20 may be controlled, and the ex-field of the channel and the channel resistance may be increased, thereby improving the write efficiency and reducing the write current. The auxiliary gate may also reduce program disturb.

The present invention may be applicable to multiple time programmable (MTP) memory. One or more implementations of the present invention MTP memory will now be described with reference to FIG. 19 to FIG. 28, wherein like reference numerals are used to refer to like elements throughout, and wherein the illustrated structures are not necessarily drawn to scale.

Figure 19:
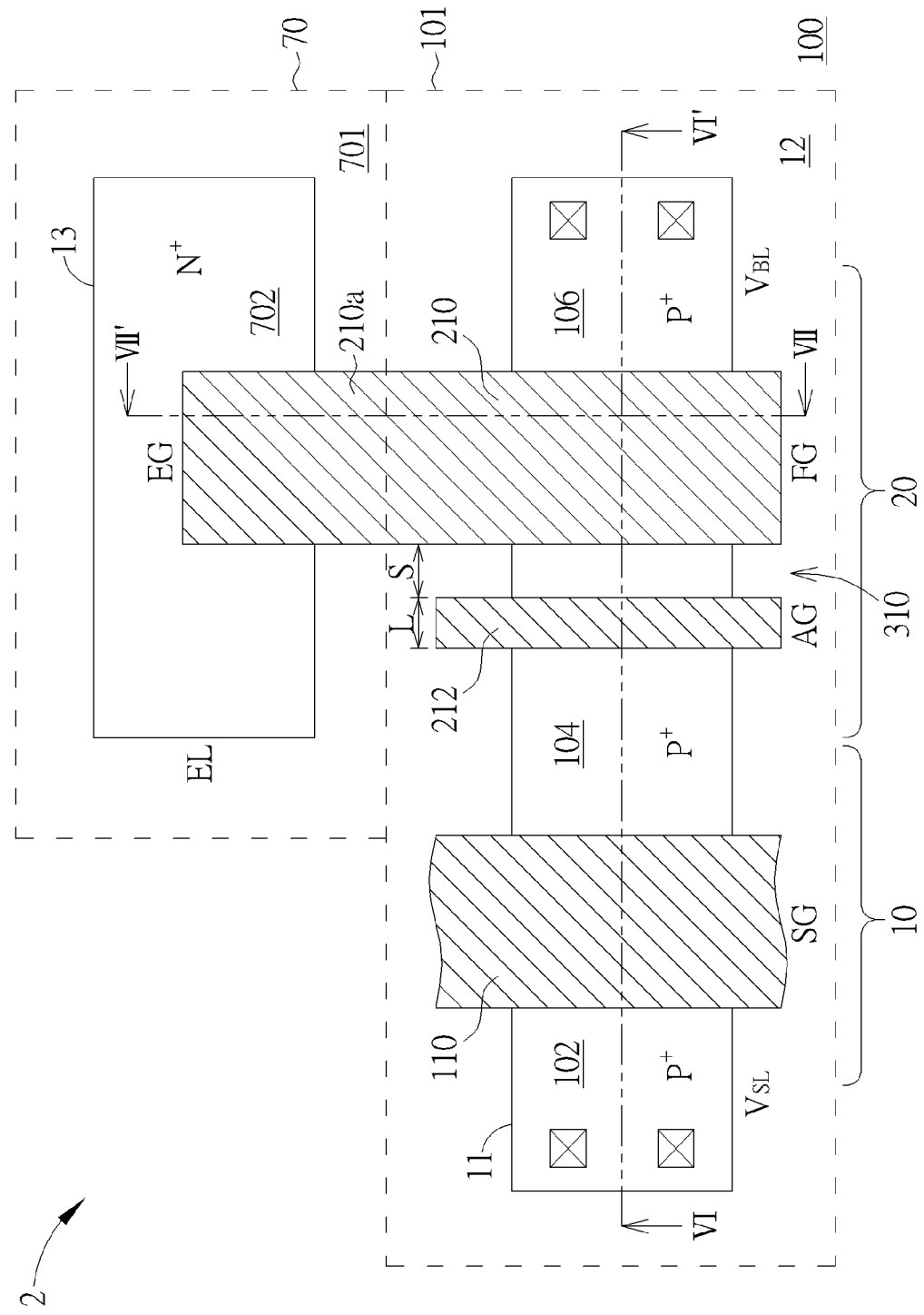
FIG. 19 illustrates an exemplary layout of an MTP memory cell unit according to another embodiment of this invention.
Figure 20:
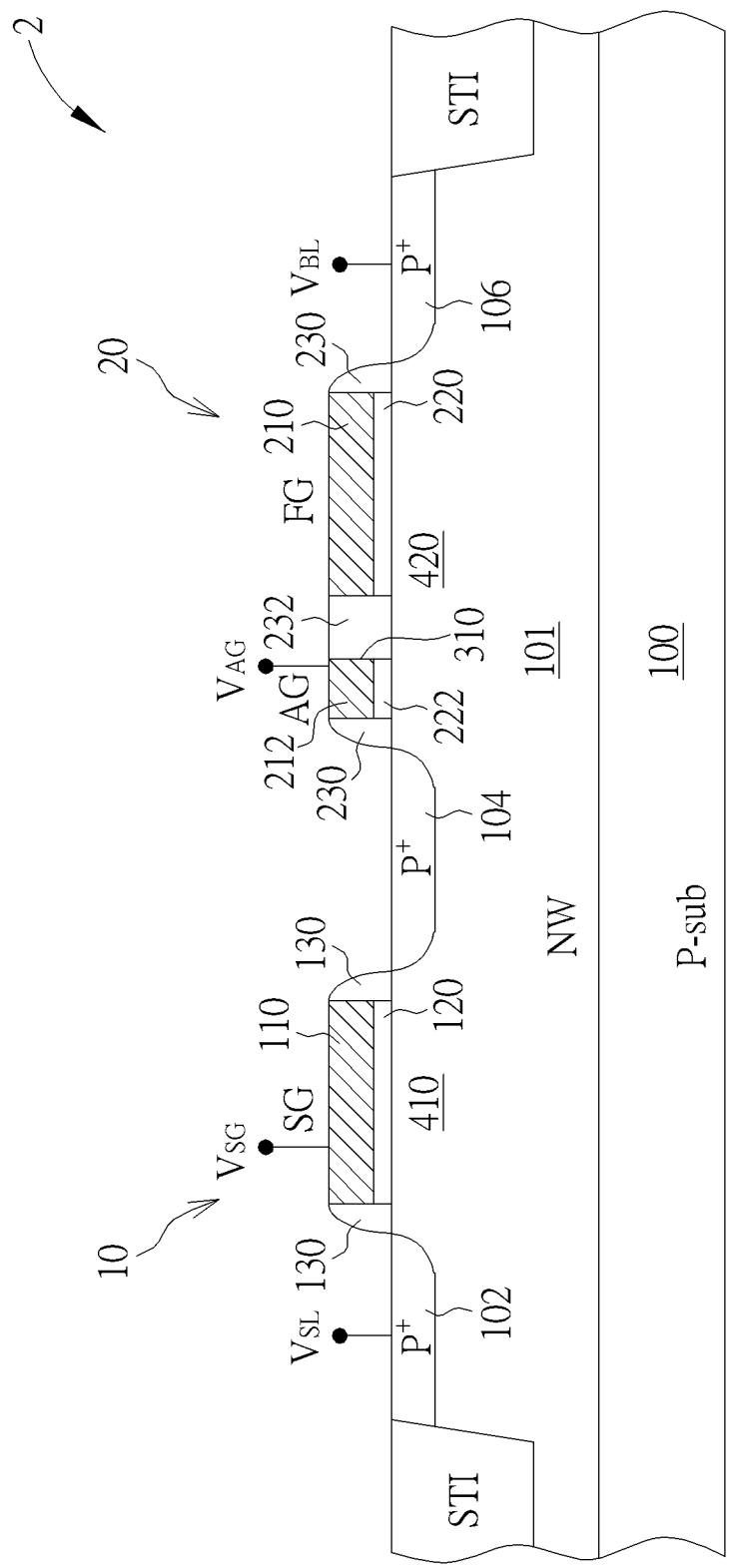
FIG. 20 is a cross-sectional view taken along line VI-VI' in FIG. 19.
Figure 21:
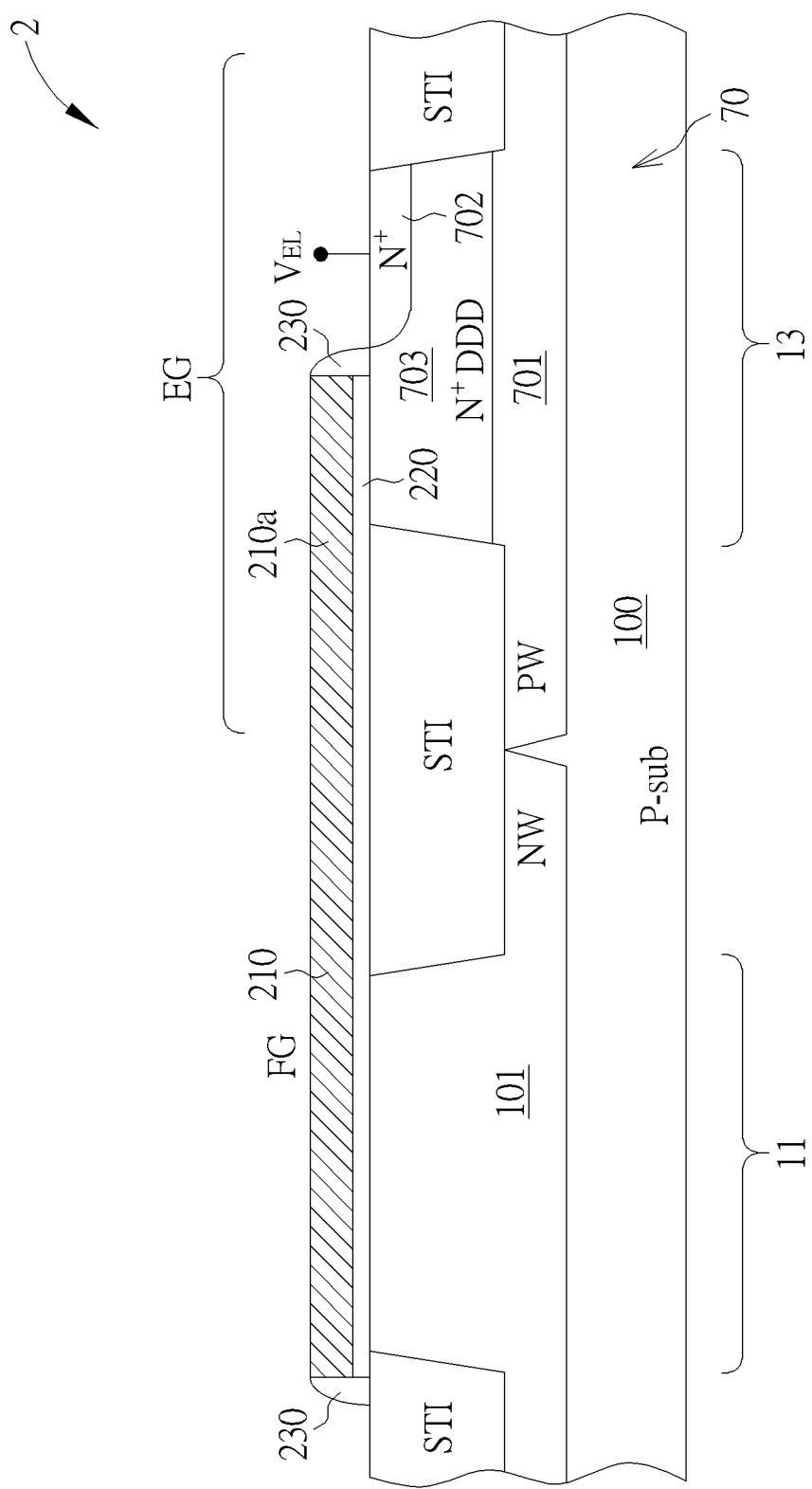
FIG. 21 is a cross-sectional view taken along line VII-VII' in FIG. 19.

Please refer to FIG. 19 to FIG. 21. FIG. 19 illustrates an exemplary layout of an MTP memory cell unit 2 according to another embodiment of this invention. FIG. 20 is a cross-sectional view taken along line VI-VI' in FIG. 19. FIG. 21 is a cross-sectional view taken along line VII-VII' in FIG. 19. As shown in FIG. 19, FIG. 20, and FIG. 21, the MTP memory cell unit 2 is different from the nonvolatile memory cell unit of FIG. 1 in that the floating gate (FG) 210 of the MTP memory cell unit 2 has a lateral extension portion 210a to form an erase gate structure 70.

As shown in FIG. 19 and FIG. 20, the MTP memory cell unit 2 comprises a first PMOS transistor 10 and a second PMOS transistor 20 that is serially connected to the first PMOS transistor 10. The first PMOS transistor 10 and the second PMOS transistor 20 are formed on an N well 101 of a P type substrate 100. Likewise, the first PMOS transistor 10 comprises a select gate (SG) 110, a P+ source doping region 102, a common P+ doping region 104, and a first gate dielectric layer 120 between the select gate (SG) 110 and the N well 101. A first channel 410 is defined between the P+ source doping region 102 and the common P+ doping region 104. The second PMOS transistor 20 comprises a floating gate (FG) 210, a P+ drain doping region 106, the common P+ doping region 104, and a second gate dielectric layer 220 between the floating gate (FG) 210 and the N well 101. A second channel 420 is defined between the common P+ doping region 104 and the P+ drain doping region 106. The common P+ doping region 104 is shared by the first PMOS transistor 10 and the second PMOS transistor 20. According to the embodiment, the second PMOS transistor 20 further comprises an auxiliary gate (AG) 212 that is disposed in close proximity to the floating gate (FG) 210. The auxiliary gate (AG) 212 extends along one side of the floating gate (FG) 210. A gap 310 is provided between the auxiliary gate (AG) 212 and the floating gate (FG) 210 such that the auxiliary gate (AG) 212 and the floating gate (FG) 210 are separated from each other at least directly above the second channel 420. According to the embodiment, the auxiliary gate (AG) 212 has an elongate strip shape and extends in parallel with the floating gate (FG) 210. According to the embodiment, the auxiliary gate (AG) 212 has a line width L that may be equal to the minimum feature size or the critical dimension (CD), and the gap 310 has a width S that may be equal to the minimum feature size or the critical dimension, but not limited thereto. According to the embodiment, the line width L of the auxiliary gate (AG) 212 may be equal to the width S of the gap 310. However, in other cases, the line width L of the auxiliary gate (AG) 212 may not be equal to the width S of the gap 310.

According to the embodiment, the select gate (SG) 110 and the floating gate (FG) 210 are both composed of a single layer of polysilicon. No control gate is formed above the floating gate (FG) 210. A first spacer 130 is disposed on either sidewall of the select gate (SG) 110. A second spacer 230 is disposed on a sidewall of the auxiliary gate (AG) 212 and on a sidewall of the floating gate (FG) 210. The gap 310 between the auxiliary gate (AG) 212 and the floating gate (FG) 210 is filled with a third spacer 232. Since the P+ source doping region 102, the common P+ doping region 104, and the P+ drain doping region 106 are implanted into the N well 101 after the formation of the first spacer 130, the second spacer 230, and the third spacer 232, and are self-aligned with the first spacer 130, the second spacer 230, and the third spacer 232, the P type dopants are not implanted into the channel 420 via the gap 310 when ion implanting the P+ source doping region 102, the common P+ doping region 104, and the P+ drain doping region 106. When program operation is performed, the auxiliary gate (AG) 212 is able to control the resistance of the channel region that is directly under the auxiliary gate (AG) 212 and close to the gap 310. By slightly raising the channel resistance at the channel region that is directly under the auxiliary gate (AG) 212 and close to the gap 310, the write current can be effectively reduced. In addition, during the program operation, the possibility of generating the electron-hole pairs at the channel region that is directly under the auxiliary gate (AG) 212 and close to the gap 310 increases, thereby improving the program efficiency. According to the embodiment, as shown in FIG. 21, the lateral extension portion 210a of the floating gate (FG) 210 laterally extends to couple to an active area 13, thereby forming an erase gate (EG) structure 70. An N+ doping region 702 is provided in the active area 13. The N+ doping region 702 is electrically coupled to an erase line (EL) or an erase line voltage ($V_{EL}$). The N+ doping region 702 is formed in a P well 701. To provide improved junction breakdown and improved erase efficiency, optionally, an N type region 703 such as an N+DDD (doubly doped drain) structure may be incorporated in the P well 701.

Figure 22:
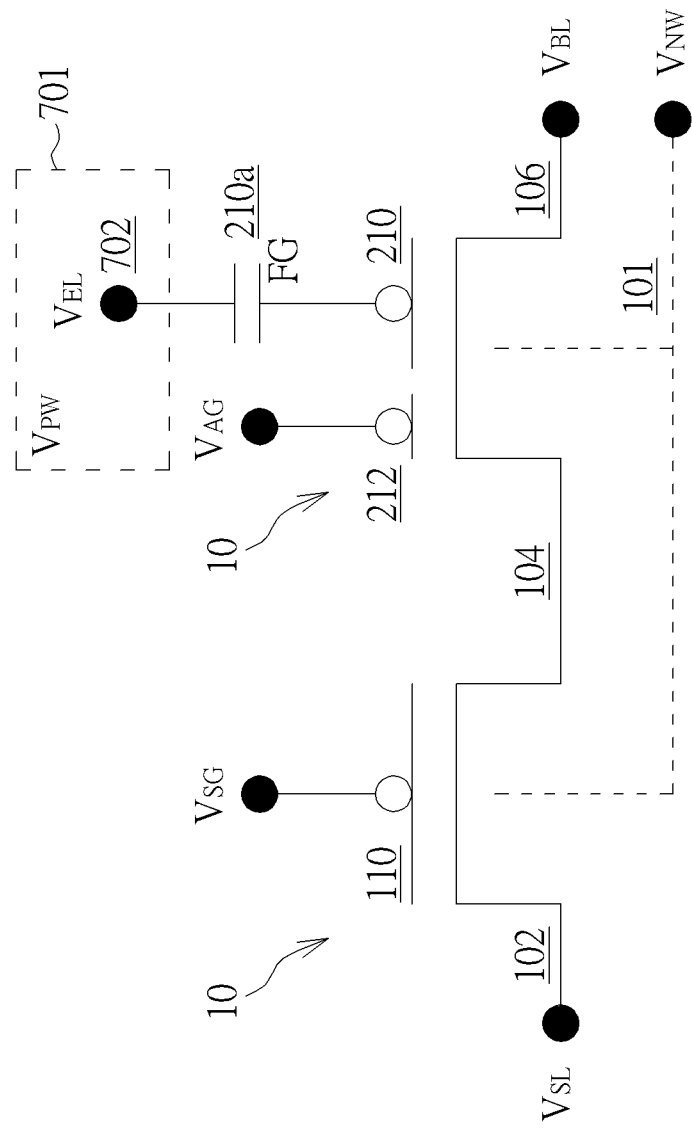
FIG. 22 is an equivalent circuit diagram of the MTP memory cell unit of FIG. 19.

Please refer to FIG. 22 and FIG. 23. FIG. 22 is an equivalent circuit diagram of the MTP memory cell unit 2 of FIG. 19. FIG. 23 is a table showing the voltage conditions of program operation, erase operation, and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. An erase line voltage ($V_{EL}$) may be applied to the N+ doping region 702. No external voltage is applied to the floating gate (FG) 210. Therefore, the floating gate (FG) 210 remains floating. An auxiliary gate voltage ($V_{AG}$) may be applied to the auxiliary gate (AG) 212. An N well voltage ($V_{NW}$) may be applied to the N well 101. A P well voltage ($V_{PW}$) may be applied to the P well 701. As shown in FIG. 23, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$, the auxiliary gate voltage ($V_{AG}$) may be a voltage between $-V_{AG}$ and $V_{AG}$, wherein $V_{AG}$=2V~15V. The erase line voltage ($V_{EL}$) may be 0V~$V_{DD}$. The P well voltage ($V_{PW}$) may be 0V. In another case, when program operation (PGM(2)) is performed, the source line voltage ($V_{SL}$) and the N well voltage ($V_{NW}$) may be 0V, the bit line voltage ($V_{BL}$) may be $-V_{PP}$, the select gate voltage ($V_{SG}$) may be $-V_{DD}$, the auxiliary gate voltage may be $-V_{DD}$ or 0V. Alternatively, the auxiliary gate voltage ($V_{AG}$) may be a voltage between $-V_{AG}$ and $V_{AG}$, wherein $V_{AG}$=2V~15V. The erase line voltage ($V_{EL}$) may be 0V~$-V_{PP}$. The P well voltage ($V_{PW}$) may be 0V. In read operation (READ), the source line voltage ($V_{SL}$) and the N well voltage ($V_{NW}$) may be $V_{DD}$, the bit line voltage ($V_{BL}$) may be 0~1V, the select gate voltage ($V_{SG}$) may be 0V~$V_{DD}$, the auxiliary gate voltage ($V_{AG}$) may be 0V~$-V_{DD}$, the erase line voltage ($V_{EL}$) may be 0V~$V_{DD}$, and the P well voltage ($V_{PW}$) may be 0V. In erase operation (ERS), the source line voltage ($V_{SL}$), the N well voltage ($V_{NW}$), the bit line voltage ($V_{BL}$), and the select gate voltage ($V_{SG}$) may be 0V. The auxiliary gate voltage may be 0V or 0V~$-V_{AG}$. The erase line voltage ($V_{EL}$) may be $V_{EE}$, wherein the $V_{EE}$ may be 5V or 20V. The P well voltage ($V_{PW}$) may be 0V.

It is to be understood that the erase gate (EG) structure 70 as set forth in FIG. 19 to FIG. 21 may be implemented and incorporated into other embodiments as described above, for example, FIG. 6, FIG. 9, and FIG. 14, to form various MTP memory cell units.

Figure 24:
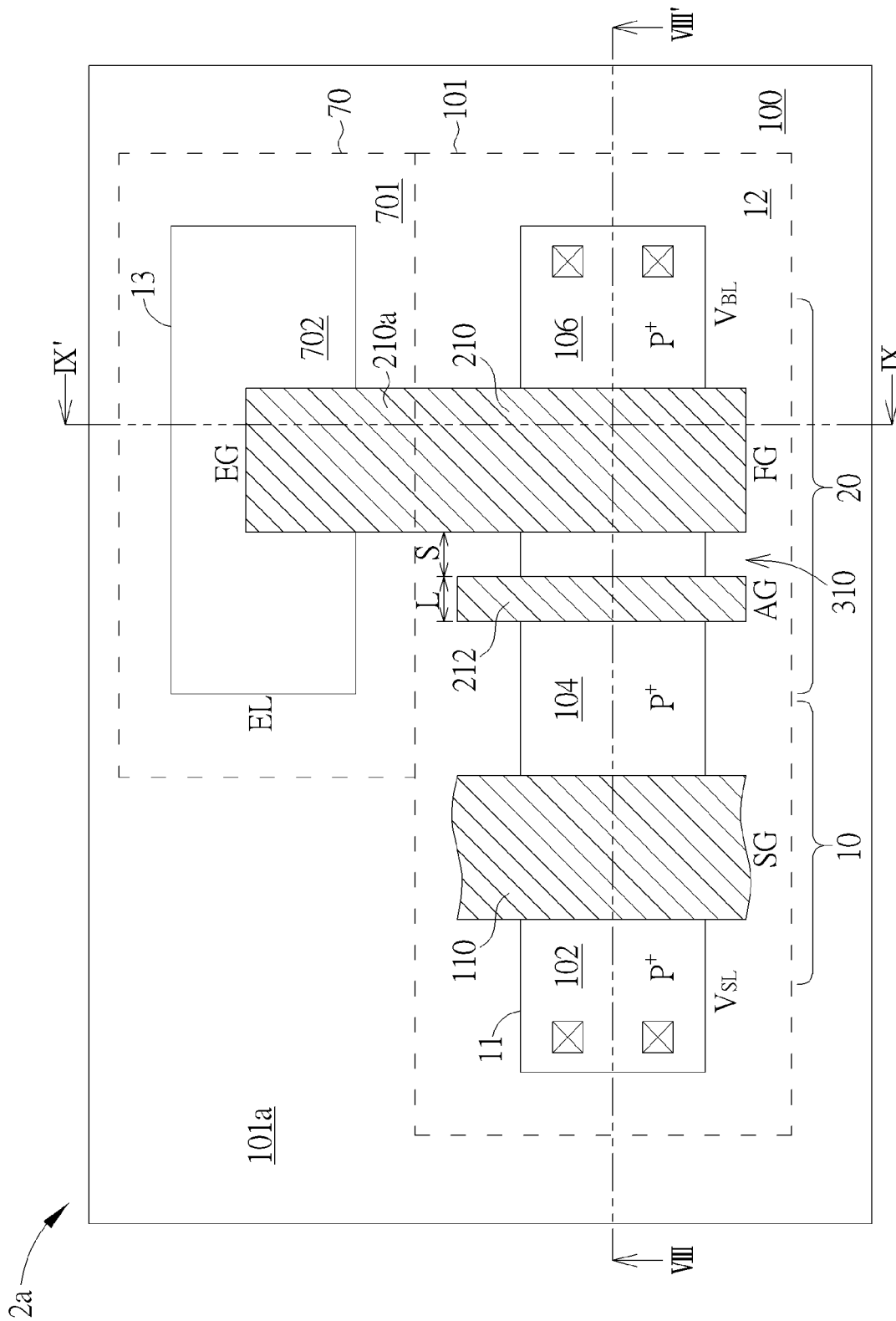
FIG. 24 illustrates an exemplary layout of an MTP memory cell unit according to still another embodiment of this invention.
Figure 25:
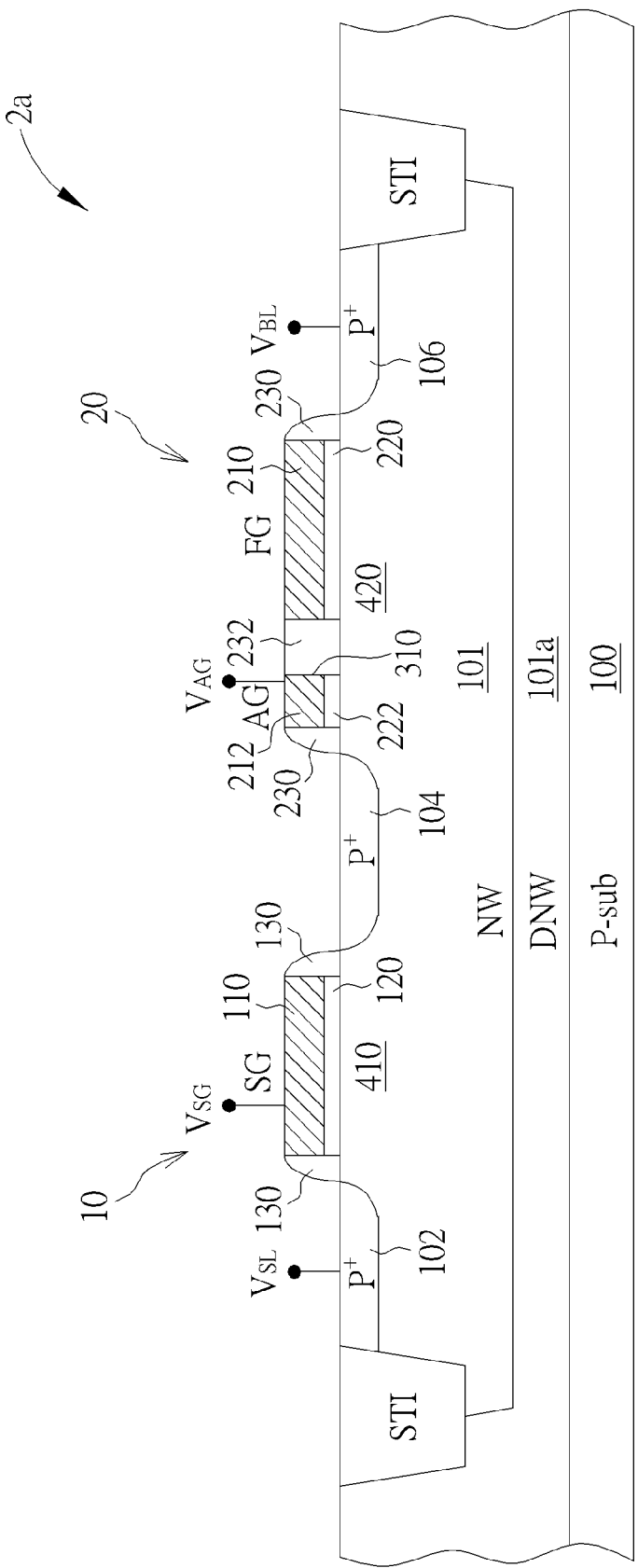
FIG. 25 is a cross-sectional view taken along line VIII-VIII' in FIG. 24.
Figure 26:
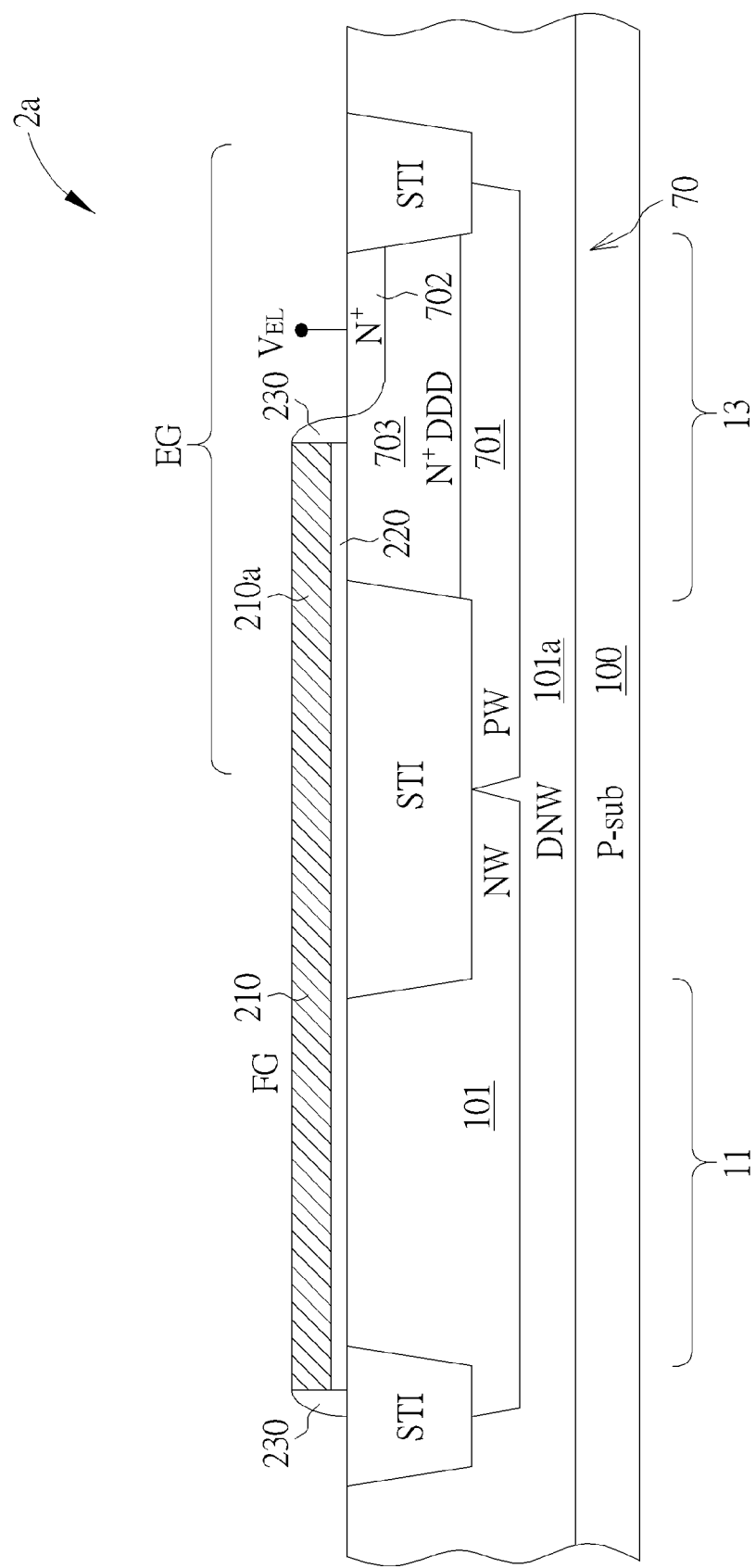
FIG. 26 is a cross-sectional view taken along line IX-IX' in FIG. 24.

Please refer to FIG. 24 to FIG. 26. FIG. 24 illustrates an exemplary layout of an MTP memory cell unit 2a according to still another embodiment of this invention. FIG. 25 is a cross-sectional view taken along line VIII-VIII' in FIG. 24. FIG. 26 is a cross-sectional view taken along line IX-IX' in FIG. 24.

As shown in FIG. 24, and FIG. 26, the MTP memory cell unit 2a is different from the MTP memory cell unit 2 of FIG. 19 in that the floating gate (FG) 210 of the MTP memory cell unit 2a has a deep N well 101a.

Likewise, the MTP memory cell unit 2a comprises a first PMOS transistor 10 and a second PMOS transistor 20 that is serially connected to the first PMOS transistor 10. The first PMOS transistor 10 and the second PMOS transistor 20 are formed on an N well 101 of a P type substrate 100. The N well 101 is formed on the deep N well 101a. Likewise, the first PMOS transistor 10 comprises a select gate (SG) 110, a P+ source doping region 102, a common P+ doping region 104, and a first gate dielectric layer 120 between the select gate (SG) 110 and the N well 101. A first channel 410 is defined between the P+ source doping region 102 and the common P+ doping region 104. The second PMOS transistor 20 comprises a floating gate (FG) 210, a P+ drain doping region 106, the common P+ doping region 104, and a second gate dielectric layer 220 between the floating gate (FG) 210 and the N well 101. A second channel 420 is defined between the common P+ doping region 104 and the P+ drain doping region 106. The common P+ doping region 104 is shared by the first PMOS transistor 10 and the second PMOS transistor 20. According to the embodiment, the second PMOS transistor 20 further comprises an auxiliary gate (AG) 212 that is disposed in close proximity to the floating gate (FG) 210. The auxiliary gate (AG) 212 extends along one side of the floating gate (FG) 210. A gap 310 is provided between the auxiliary gate (AG) 212 and the floating gate (FG) 210 such that the auxiliary gate (AG) 212 and the floating gate (FG) 210 are separated from each other at least directly above the second channel 420. According to the embodiment, the auxiliary gate (AG) 212 has an elongate strip shape and extends in parallel with the floating gate (FG) 210. According to the embodiment, the auxiliary gate (AG) 212 has a line width L that may be equal to the minimum feature size or the critical dimension (CD), and the gap 310 has a width S that may be equal to the minimum feature size or the critical dimension, but not limited thereto. According to the embodiment, the line width L of the auxiliary gate (AG) 212 may be equal to the width S of the gap 310. However, in other cases, the line width L of the auxiliary gate (AG) 212 may not be equal to the width S of the gap 310.

According to the embodiment, the select gate (SG) 110 and the floating gate (FG) 210 are both composed of a single layer of polysilicon. No control gate is formed above the floating gate (FG) 210. A first spacer 130 is disposed on either sidewall of the select gate (SG) 110. A second spacer 230 is disposed on a sidewall of the auxiliary gate (AG) 212 and on a sidewall of the floating gate (FG) 210. The gap 310 between the auxiliary gate (AG) 212 and the floating gate (FG) 210 is filled with a third spacer 232. Since the P+ source doping region 102, the common P+ doping region 104, and the P+ drain doping region 106 are implanted into the N well 101 after the formation of the first spacer 130, the second spacer 230, and the third spacer 232, and are self-aligned with the first spacer 130, the second spacer 230, and the third spacer 232, the P type dopants are not implanted into the channel 420 via the gap 310 when ion implanting the P+ source doping region 102, the common P+ doping region 104, and the P+ drain doping region 106. When program operation is performed, the auxiliary gate (AG) 212 is able to control the resistance of the channel region that is directly under the auxiliary gate (AG) 212 and close to the gap 310. By slightly raising the channel resistance at the channel region that is directly under the auxiliary gate (AG) 212 and close to the gap 310, the write current can be effectively reduced. In addition, during the program operation, the possibility of generating the electron-hole pairs at the channel region that is directly under the auxiliary gate (AG) 212 and close to the gap 310 increases, thereby improving the program efficiency. According to the embodiment, as shown in FIG. 26, the lateral extension portion 210a of the floating gate (FG) 210 laterally extends to couple to an active area 13, thereby forming an erase gate (EG) structure 70. An N+ doping region 702 is provided in the active area 13. The N+ doping region 702 is electrically coupled to an erase line (EL) or an erase line voltage ($V_{EL}$). The N+ doping region 702 is formed in a P well 701. To provide improved junction breakdown and improved erase efficiency, optionally, an N type region 703 such as an N+DDD (doubly doped drain) structure may be incorporated in the P well 701. According to the embodiment, the N well 101 and the P well 701 are formed within the same deep N well 101a.

Figure 27:
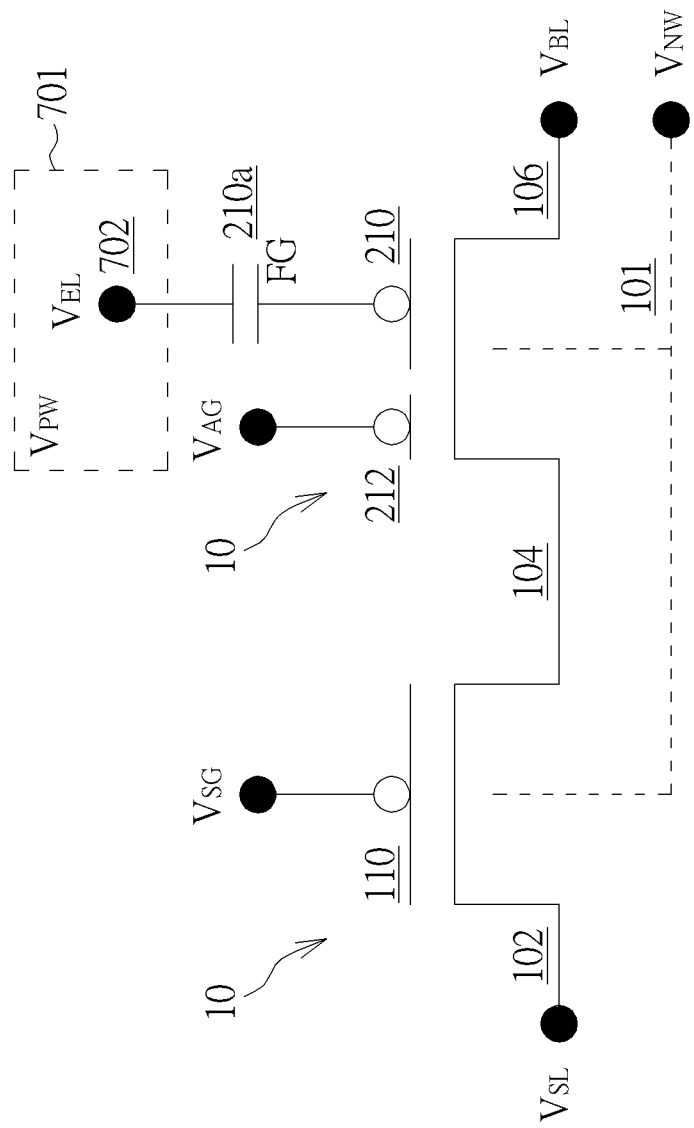
FIG. 27 is an equivalent circuit diagram of the MTP memory cell unit of FIG. 24.

Please refer to FIG. 27 and FIG. 28. FIG. 27 is an equivalent circuit diagram of the MTP memory cell unit 2a of FIG. 24. FIG. 28 is a table showing the voltage conditions of program operation, erase operation, and read operation of the cell unit. According to the embodiment, in operation, the first PMOS transistor 10 acts as a select transistor. A select gate voltage ($V_{SG}$) or a word line voltage ($V_{WL}$) may be applied to the select gate (SG) 110. A source line voltage ($V_{SL}$) may be applied to the P+ source doping region 102. A bit line voltage ($V_{BL}$) may be applied to the P+ drain doping region 106 of the second PMOS transistor 20. An erase line voltage ($V_{EL}$) may be applied to the N+ doping region 702. No external voltage is applied to the floating gate (FG) 210. Therefore, the floating gate (FG) 210 remains floating. An auxiliary gate voltage ($V_{AG}$) may be applied to the auxiliary gate (AG) 212. An N well voltage ($V_{NW}$) may be applied to the N well 101. A deep N well voltage ($V_{DNW}$) may be applied to the deep N well 101a. A P well voltage ($V_{PW}$) may be applied to the P well 701. As shown in FIG. 28, in program operation (PGM(1)), the source line voltage ($V_{SL}$) and the N well voltage ($V_{NW}$) may be $V_{PP}$, the bit line voltage ($V_{BL}$) may be 0V, the select gate voltage ($V_{SG}$) may be $V_{DD}$, the auxiliary gate voltage ($V_{AG}$) may be $V_{DD}$ or 0V. Alternatively, the auxiliary gate voltage ($V_{AG}$) may be a voltage between $-V_{AG}$ and $V_{AG}$, wherein $V_{AG}=2V\sim15V$. The erase line voltage ($V_{EL}$) may be 0V~$V_{DD}$. The P well voltage ($V_{PW}$) may be 0V. The deep N well voltage ($V_{DNW}$) may be $V_{PP}$. In another case, when program operation (PGM(2)) is performed, the source line voltage ($V_{SL}$), the N well voltage ($V_{NW}$) and the deep N well voltage ($V_{DNW}$) may be 0V, the bit line voltage ($V_{BL}$) may be $-V_{PP}$, the select gate voltage ($V_{SG}$) may be $-V_{DD}$, the auxiliary gate voltage may be a voltage between $-V_{AG}$ and $V_{AG}$, wherein $V_{AG}=2V\sim15V$. The erase line voltage ($V_{EL}$) may be 0V~$-V_{PP}$. The P well voltage ($V_{PW}$) may be 0V. In read operation (READ), the source line voltage ($V_{SL}$), the N well voltage ($V_{NW}$) and the deep N well voltage ($V_{DNW}$) may be $V_{DD}$, the bit line voltage ($V_{BL}$) may be 0~1V, the select gate voltage ($V_{SG}$) may be 0V~$V_{DD}$, the auxiliary gate voltage ($V_{AG}$) may be 0V~$-V_{DD}$, the erase line voltage ($V_{EL}$) may be $0V\sim V_{DD}$, and the P well voltage ($V_{PW}$) may be 0V. In erase operation (ERS), the source line voltage ($V_{SL}$), the N well voltage ($V_{NW}$), the bit line voltage ($V_{BL}$), the select gate voltage ($V_{SG}$) and the deep N well voltage ($V_{DNW}$) may be 0V. The auxiliary gate voltage may be 0V or $0V\sim -V_{DD}$. The erase line voltage ($V_{EL}$) may be $V_{EE}$, wherein the $V_{EE}$ may be 5V or 20V. The P well voltage ($V_{PW}$) may be 0V.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory cell unit, comprising:
   a P type substrate;
   an N well in the P type substrate; and
   a PMOS storage transistor disposed on the N well, wherein the PMOS storage transistor comprises a floating gate, a P+ drain doping region, a common P+ doping region, a floating gate dielectric layer between the floating gate and the N well, a floating gate channel between the P+ drain doping region and the common P+ doping region, and an auxiliary gate disposed in close proximity to one side of the floating gate, wherein a gap is provided between the auxiliary gate and the floating gate such that the auxiliary gate and the floating gate are separated from each other at least directly above the floating gate channel.

2. The nonvolatile memory cell unit according to claim 1 further comprising a PMOS select transistor disposed on the N well, wherein the PMOS select transistor comprises a select gate, a P+ source doping region, the common P+ doping region, and a select gate dielectric layer between the select gate and the N well.

3. The nonvolatile memory cell unit according to claim 2 further comprising a select gate channel between the P+ source doping region and the common P+ doping region.

4. The nonvolatile memory cell unit according to claim 2 wherein the common P+ doping region is shared together by the PMOS select transistor and the PMOS storage transistor such that the PMOS storage transistor is serially connect to the PMOS select transistor.

5. The nonvolatile memory cell unit according to claim 1 wherein the auxiliary gate has an elongate strip shape and extends in parallel with the floating gate.

6. The nonvolatile memory cell unit according to claim 2 wherein the select gate and the floating gate are both composed of a single layer of polysilicon.

7. The nonvolatile memory cell unit according to claim 2 wherein a first spacer is disposed on either sidewall of the select gate, wherein a second spacer is disposed on a sidewall of the auxiliary gate and a sidewall of the floating gate, and wherein the gap is filled with a third spacer.

8. The nonvolatile memory cell unit according to claim 1 further comprising a connecting portion between the auxiliary gate and the floating gate, wherein the connecting portion is situated directly on a shallow trench isolation structure, and wherein the connecting portion electrically connects the auxiliary gate with the floating gate.

9. The nonvolatile memory cell unit according to claim 2 wherein the select gate, the floating gate, and the auxiliary gate extend along a first direction, wherein the select gate and the floating gate traverse an active area on the first direction, while the auxiliary gate, on the first direction, does not traverse the active area.

10. The nonvolatile memory cell unit according to claim 1 wherein the auxiliary gate is divided into two separated parts on the floating gate channel.

11. The nonvolatile memory cell unit according to claim 1 wherein the floating gate comprises a lateral extension portion that is coupled to an N+ doping region in a P well.

12. The nonvolatile memory cell unit according to claim 11 further comprising an N type region in the P well.

13. The nonvolatile memory cell unit according to claim 11 wherein the lateral extension portion of the floating gate, the N+ doping region, and the P well together constitute an erase gate structure.

14. The nonvolatile memory cell unit according to claim 1 wherein a deep N well is disposed under the N well.

15. A nonvolatile memory cell unit, comprising:
    a semiconductor substrate having a first conductivity type;
    a well of a second conductivity type in the semiconductor substrate;
    a select transistor disposed on the well; and
    a storage transistor disposed on the well and being serially connected to the select transistor, wherein the storage transistor comprises a juxtaposed dual-gate structure that is disposed on a channel region of the storage transistor.

16. The nonvolatile memory cell unit according to claim 15 wherein the juxtaposed dual-gate structure comprises an auxiliary gate and a floating gate.

17. The nonvolatile memory cell unit according to claim 16 further comprising a connecting portion between the auxiliary gate and the floating gate, wherein the connecting portion is situated directly on a shallow trench isolation structure, and wherein the connecting portion electrically connects the auxiliary gate with the floating gate.

18. The nonvolatile memory cell unit according to claim 16 wherein a gap is provided between the auxiliary gate and the floating gate such that the auxiliary gate and the floating gate are separated from each other at least directly above the channel region.

19. The nonvolatile memory cell unit according to claim 18 wherein the gap is filled with a spacer.

20. The nonvolatile memory cell unit according to claim 15 wherein the select transistor and the storage transistor are both PMOS transistors.

21. The nonvolatile memory cell unit according to claim 20 wherein the select transistor and the storage transistor commonly share a common P+ doping region.

22. The nonvolatile memory cell unit according to claim 16 wherein the floating gate comprises a lateral extension portion that is coupled to an N+ doping region in a P well.

23. The nonvolatile memory cell unit according to claim 22 further comprising an N type region in the P well.

24. The nonvolatile memory cell unit according to claim 22 wherein the lateral extension portion of the floating gate, the N+ doping region, and the P well together constitute an erase gate structure.

25. The nonvolatile memory cell unit according to claim 15 wherein a deep well of the second conductivity type is disposed under the well of the second conductivity type.

* * * * *